United States Patent
Akiyama et al.

(10) Patent No.: US 7,723,444 B2
(45) Date of Patent: May 25, 2010

(54) EPOXY RESIN COMPOSITION, PROCESS FOR PROVIDING LATENCY TO THE COMPOSITION AND A SEMICONDUCTOR DEVICE

(75) Inventors: Yoshihito Akiyama, Ota-ku (JP); Naoki Tomida, Utsunomiya (JP)

(73) Assignee: Sumitomo Bakelite Co., Ltd. (JP)

( * ) Notice: Subject to any disclaimer, the term of this patent is extended or adjusted under 35 U.S.C. 154(b) by 366 days.

(21) Appl. No.: 11/336,434

(22) Filed: Jan. 20, 2006

(65) Prior Publication Data

US 2006/0189721 A1 Aug. 24, 2006

(30) Foreign Application Priority Data

Jan. 20, 2005 (JP) .............................. 2005-013354
Dec. 13, 2005 (JP) .............................. 2005-358492
Dec. 13, 2005 (JP) .............................. 2005-358493

(51) Int. Cl.
C08L 63/00 (2006.01)
C08L 63/02 (2006.01)
C08L 63/04 (2006.01)
H01L 23/29 (2006.01)

(52) U.S. Cl. ........................ 525/481; 257/793; 525/502; 525/508; 525/523; 525/530; 525/533

(58) Field of Classification Search ........................ None
See application file for complete search history.

(56) References Cited

U.S. PATENT DOCUMENTS

| | | | | |
|---|---|---|---|---|
| 3,560,394 | A | * | 2/1971 | Plueddemann et al. . 252/182.14 |
| 3,576,025 | A | * | 4/1971 | Frye ............................ 556/442 |
| 2004/0214003 | A1 | * | 10/2004 | Umeno et al. ............... 428/413 |
| 2005/0075474 | A1 | * | 4/2005 | Horimoto et al. ............. 528/88 |

FOREIGN PATENT DOCUMENTS

| | | | | |
|---|---|---|---|---|
| EP | 1369445 | A1 | * | 12/2003 |
| JP | 63-225616 | A | * | 9/1988 |
| JP | 05-131486 | | | 5/1993 |
| JP | 7-37041 | | | 4/1995 |
| JP | 08-253555 | | | 10/1996 |
| JP | 10-025335 | | | 1/1998 |
| JP | 2001-098053 | | | 4/2001 |
| JP | 2001-98053 | A | * | 4/2001 |
| JP | 2004-269713 | A | * | 9/2004 |
| JP | 2005-89486 | A | * | 4/2005 |
| JP | 2005-162846 | A | * | 6/2005 |
| JP | 2005-206725 | A | * | 8/2005 |

\* cited by examiner

*Primary Examiner*—Robert Sellers
(74) *Attorney, Agent, or Firm*—Smith, Gambrell & Russell

(57) ABSTRACT

An epoxy resin composition which comprises an epoxy resin (A), a curing agent (B), a curing accelerator (C) and a component retarding curing of the epoxy resin (D) which is at least one component selected from components (a), (b) and (c) represented by general formulae [1], [2] and [3], respectively, a semiconductor device having a semiconductor element encapsulated by using the composition, and a process for providing latency to an epoxy resin composition. The epoxy resin exhibits excellent storage stability, excellent fluidity and curing property during encapsulating by molding and excellent resistance to soldering without forming cleavages or cracks by the soldering treatment at high temperatures in accordance with the lead-free soldering. An epoxy resin composition can be provided with latency by adjusting the amounts of the curing accelerator and the component for retarding curing.

(a) An anion component represented by general formula [1]:

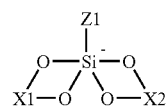

[1]

(b) A compound represented by general formula [2]:

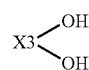

[2]

(c) A silane compound represented by general formula [3]:

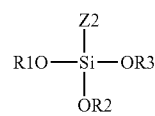

[3]

19 Claims, No Drawings

EPOXY RESIN COMPOSITION, PROCESS FOR PROVIDING LATENCY TO THE COMPOSITION AND A SEMICONDUCTOR DEVICE

TECHNICAL FIELD

The present invention relates to an epoxy resin composition for encapsulating semiconductors and a semiconductor device prepared by using the composition.

BACKGROUND ART

As the process for sealing semiconductor elements such as IC and LSI, encapsulating by molding using a molding material of an epoxy resin composition (also referred to as "an epoxy resin molding material", hereinafter) is suitable for mass production at a low cost and has been used for a long time. With respect to the reliability, the properties of the epoxy resin compositions have been improved by improving the epoxy resin and a phenol resin used as the crosslinking agent. However, electronic instruments have decreased sizes and weights and exhibit enhanced performances as the recent trend of the market, the degree of integration of semiconductors continues to increase, and the surface mounting of semiconductor devices has been promoted. Due to the above situation, requirements to the epoxy resin compositions for encapsulating semiconductors are becoming harder, and problems which cannot be overcome with conventional epoxy resin compositions are arising.

The greatest among such problems is the phenomenon that semiconductor devices are rapidly exposed to a high temperature such as 200° C. or higher in the step of dipping into a solder or in the step of solder reflow due to adoption of the surface mounting, and cleavages caused by the stress formed by explosive vaporization of absorbed moisture take place at the inside of semiconductor devices, in particular, at the interface of the cured epoxy resin composition and various plated portions used for bonding such as gold-plated portions and silver-plated portions on semiconductor elements, lead frames and inner leads. This phenomenon causes a great damage to the reliability. Moreover, the change of solders containing lead into lead-free solders due to the environmental problems increases the temperature of the soldering treatment, and the resistance to soldering under explosive stress formed by vaporization of moisture contained in the semiconductor devices is required more greatly than before.

To overcome the decrease in the reliability due to the soldering treatment, a process in which the amount of an inorganic filler in an epoxy resin composition is increased so that a decrease in the absorption of moisture, an increase in the strength and a decrease in the expansion under heating are achieved and the resistance to soldering is improved, and a resin having a small melt viscosity is used so that low viscosity and excellent fluidity during molding is maintained, is proposed (for example Patent Reference 1). Although the resistance to soldering can be improved considerably by using this process, this process has a drawback in that fluidity is sacrificed by the increase in the amount of the inorganic filler, and cavities tend to be formed due to insufficient filling of the space in a package with the epoxy resin composition. A process in which various coupling agents such as aminosilanes and mercaptosilanes are added and fluidity and resistance to soldering are simultaneously exhibited so that formation of cleavages at the interface of plated portions and the cured epoxy resin composition is prevented, is proposed (for example, Patent Reference 2). However, this method does not succeed in obtaining an epoxy resin composition for encapsulating semiconductors exhibiting the sufficient results. Technology for satisfying the reliability without adversely affecting the fluidity and the filling property even when the amount of the inorganic filler is increased has been desired.

On the other hand, an adduct of a tertiary phosphine with a quinone exhibiting an excellent quick curing property is added to an epoxy resin composition used in the electric and electronic fields as the curing accelerator so that the curing reaction of the resin during the curing is accelerated (for example, Patent Reference 3).

When the above curing accelerator is used, the curing reaction of the epoxy resin proceeds early in the initial period of the curing reaction although the reaction is not fast since the temperature range showing the effect to accelerate curing extends to relatively low temperatures, and the molecular weight of the resin composition (the molding material) increases due to the reaction. The increase in the molecular weight increases the viscosity of the resin and, as the result, a problem such as defect molding arises due to the insufficient fluidity when a resin composition (a molding material) contains a great amount of a filler to improve the reliability.

Various attempts have been made to protect a reactive substrate using a component suppressing the curing property so that the fluidity is improved. This method is called the method of latency. For example, curing accelerators provided with latency by converting a phosphonium ion into a salt with a strongly anionic compound so that the active point of the curing accelerators is protected, are known (for example, Patent References 4 to 5). However, it is difficult that the curing property and the fluidity are simultaneously improved with these salts since the suppressing component remains throughout the initial period to the final period of the reaction. Thus, the above salts are not satisfactory.

[Patent Reference 1] Japanese Patent Application Publication No. Heisei 7 (1995)-37041 (pages 1 to 9)

[Patent Reference 2] Japanese Patent Application Laid-Open No. Heisei 8 (1996)-253555 (pages 2 to 9)

[Patent Reference 3] Japanese Patent Application Laid-Open No. Heisei 10 (1998)-25335 (page 2)

[Patent Reference 4] Japanese Patent Application Laid-Open No. 2001-98053 (page 5)

[Patent Reference 5] U.S. Pat. No. 4,171,420 (pages 2 to 4)

DISCLOSURE OF THE INVENTION

The present invention has been made under the above circumstances and has an object of providing an epoxy resin composition exhibiting excellent storage stability, excellent fluidity and curing property during encapsulating by molding and excellent resistance to soldering without forming cleavages or cracks by the soldering treatment at high temperatures in accordance with the lead-free soldering, a process for providing latency to an epoxy resin composition, and a semiconductor device exhibiting excellent reliability.

As the result of intensive studies by the present inventors to overcome the above problems, it was found that the undesirable increase in the molecular weight during storage or at the initial period of the curing reaction of the composition (the molding material) was suppressed, and problems caused by insufficient fluidity such as defect molding could be prevented by using for an epoxy resin composition a combination of a curing accelerator and a specific component for retarding curing which provided latency to the function of the curing accelerator. It was also found by the present inventors that, by protecting the curing accelerator with an anion having a specific chelate structure, the chelate structure of the anion could be decomposed as the curing reaction proceeded and the excellent curing property and the latency could be exhibited simultaneously. It was also found that the degree of latency could be adjusted by using, in combination with the anion having the chelate structure, a compound which could regenerate the chelate structure after the chelate structure was decomposed.

It was also found by the present inventors that, when the anion having the chelate structure was added in combination with a material compound which could form a chelate structure, the anion having the chelate structure could be formed in the reaction system as the curing reaction of the epoxy resin proceeds, and the latency could be exhibited.

It was also found by the present inventors that the epoxy resin composition (the molding material) obtained in accordance with the above process could exhibit the excellent fluidity and the excellent curing property even when an inorganic filler was used in a great amount.

The present invention provides:

(1) An epoxy resin composition which comprises an epoxy resin (A), a curing agent (B), a curing accelerator (C) and a component retarding curing of the epoxy resin (D) which is at least one component selected from following component (a) to component (c):

(a) an anion component represented by following general formula [1]:

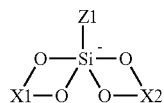

[1]

wherein X1 and X2 each represent an organic group and may represent a same group or different groups, and Z1 represents a substituted or unsubstituted organic group having an aromatic ring or a heterocyclic ring or a substituted or unsubstituted aliphatic group;

(b) a compound represented by following general formula [2]:

[2]

wherein X3 represents an organic group;

(c) a silane compound represented by following general formula. [3]:

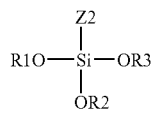

[3]

wherein R1, R2 and R3 each represent an aliphatic group having 1 to 3 carbon atoms and may represent a same group or different groups, and Z2 represents a substituted or unsubstituted organic group having an aromatic ring or a heterocyclic ring or a substituted or unsubstituted aliphatic group;

(2) The epoxy resin composition described in (1), wherein the curing accelerator of component (C) is a compound having phosphorus atom;

(3) The epoxy resin composition described in any one of (1) and (2), wherein the curing accelerator of component (C) is a compound having a cation portion in a molecule;

(4) The epoxy resin composition described in (3), wherein the compound having a cation portion in a molecule is at least one tetra-substituted organic phosphorus compound selected from tetra-substituted phosphonium salts (c1), phospho-betain compounds (c2) and adducts of a phosphine compound with a quinone compound (c3)

(5) The epoxy resin composition described in (3), wherein the compound having a cation portion in a molecule is a compound represented by following general formula [4]:

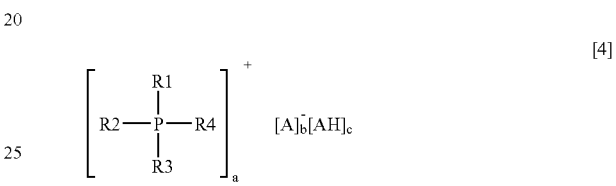

[4]

wherein P represents phosphorus atom, R1, R2, R3 and R4 each represent a substituted or unsubstituted aromatic group or alkyl group and may represent a same group or different groups, A represents an anion of an aromatic organic acid having at least one functional group selected from hydroxyl group, carboxyl group and thiol group on an aromatic ring, AH represents an aromatic organic acid having at least one functional group selected from hydroxyl group, carboxyl group and thiol group on an aromatic ring, a and b each represent an integer which is 1 or greater and 3 or smaller, c represents an integer which is 0 or greater and 3 or smaller, and a=b;

(6) The epoxy resin composition described in (3), wherein the compound having a cation portion in a molecule is a compound represented by following formula [5]:

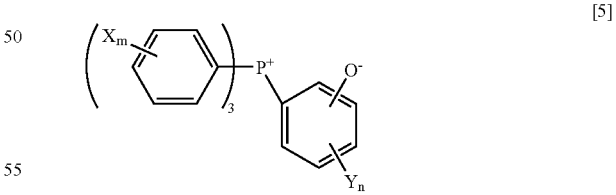

[5]

wherein X represents hydrogen atom or an alkyl group having 1 or more and 3 or less carbon atoms, Y represents hydrogen atom or hydroxyl group, and m and n each represent a integer which is 1 or greater and 3 or smaller;

(7) The epoxy resin composition described in (3), wherein the compound having a cation portion in a molecule is a compound represented by following formula [6]:

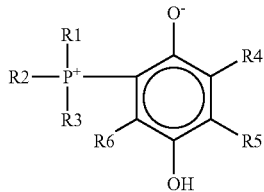

[6]

wherein P represents phosphorus atom, R1 to R3 each represent a substituted or unsubstituted alkyl group having 1 to 12 carbon atoms or a substituted or unsubstituted aryl group having 6 to 12 carbon atoms and may represent a same group or different groups, R4 to R6 each represent hydrogen atom or a hydrocarbon group having 1 to 12 groups, an atom and groups represented by BA to R6 may be a same with or different from each other, and the groups represented by R4 and R5 may be bonded to each other to form a cyclic structure;

(8) An epoxy resin composition according to any one of (3) to (7), wherein the component retarding curing of the epoxy resin (D) is at least one component selected from following component (a') to component (c'):

(a') an anion component represented by following general formula [1]:

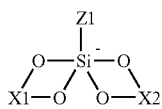

[1]

wherein X1 and X2 each represent an organic group and may represent a same group or different groups, and Z1 represents a substituted or unsubstituted organic group having an aromatic ring or a heterocyclic ring or a substituted or unsubstituted aliphatic group;

(b') the anion component represented by above general formula [1] and a compound represented by following general formula [2]:

[2]

wherein X3 represents an organic group;

(c') the compound represented by above general formula [2] and a silane compound represented by following general formula [3]:

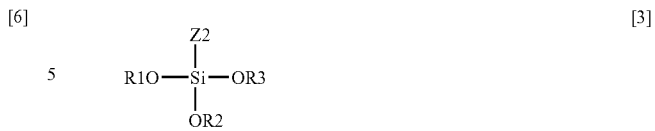

[3]

wherein R1, R2 and R3 each represent an aliphatic group having 1 to 3 carbon atoms and may represent a same group or different groups, and Z2 represents a substituted or unsubstituted organic group having an aromatic ring or a heterocyclic ring or a substituted or unsubstituted aliphatic group;

(9) The epoxy resin composition described in any one of (1) to (8), wherein the component retarding curing of the epoxy resin of component (D) is a phenylsilane compound represented by following formula [7]:

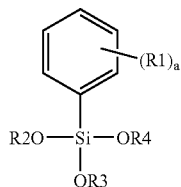

[7]

wherein R1 represents hydrogen atom or a hydrocarbon group having 4 or less carbon atoms, R2, R8 and R4 each represent an aliphatic group having 1 to 8 carbon atoms and may represent a same group or different groups, and a represents an integer which is 1 or greater and 5 or smaller;

(10) The epoxy resin composition described in any one of (1) to (9), wherein the component retarding curing of the epoxy resin of component (D) comprises the phenylsilane compound represented by formula [7] and a compound in which hydroxyl group is bonded to each of two or more adjacent carbon atoms constituting an aromatic ring;

(11) The epoxy resin composition described in (10), wherein the aromatic ring is benzene ring or naphthalene ring;

(12) The epoxy resin composition described in any one of (9) to (11), wherein an amount of the phenylsilane compound represented by formula [7] is 0.05% by weight or more and 0.5% by weight or less based on an amount of an entire epoxy resin composition;

(13) The epoxy resin composition described in any one of (1) to (12), wherein the epoxy resin of component (A) is an epoxy resin represented by following general formula [8]:

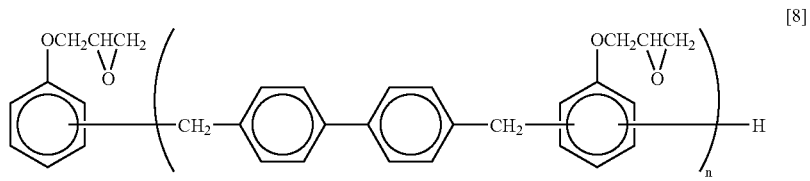

[8]

wherein n represents an average value which is a positive number of 1 to 10;

(14) The epoxy resin composition described in any one of (1) to (13), wherein the curing agent of component (B) is a phenol resin represented by following general formula [9]:

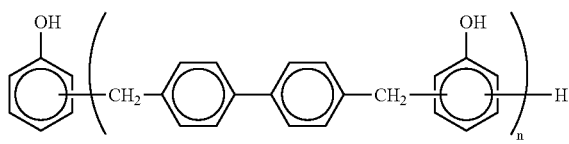

[9]

wherein n represents an average value which is a positive number of 1 to 10;

(15) The epoxy resin composition described in any one of (3) to (14), wherein the compound having a cation portion in a molecule which is the curing accelerator and the component retarding curing of the epoxy resin of component (D) are mixed with each other in advance;

(16) The epoxy resin composition described in any one of (1) to (15), which further comprises an inorganic filler;

(17) The epoxy resin composition described in 16, wherein an amount of the inorganic filler is 80% by weight or more and 9410/a by weight or less based on an amount of an entire epoxy resin composition;

(18) An epoxy resin molding material for encapsulating semiconductors which is obtained by mixing and/or melt mixing the epoxy resin composition 10 described in any one of (1) to (17);

(19) A semiconductor device which comprises a semiconductor element encapsulated by using the epoxy resin molding material for encapsulating semiconductors described in (18); and

(20) A process for providing latency to an epoxy resin composition which comprises retarding curing of the epoxy resin composition described in any one of (3) to (17) by adjusting an amount of the component retarding curing of the epoxy resin relative to an amount of the compound having a cation portion in a molecule of the curing accelerator.

epoxy resin composition for encapsulating semiconductors which exhibits excellent fluidity and storage property without adversely affecting the curing property, excellent storage stability, excellent fluidity and frilling property during encapsulating by molding of semiconductor elements and excellent resistance to soldering without forming cleavages or cracks by the soldering treatment at high temperatures in accordance with the lead-free soldering, can be obtained.

A process for providing latency, i.e., retardation of curing of the epoxy resin composition, by adjusting the amount of the component for retarding curing of component (D) relative to the amount of the curing accelerator of component (C) in the epoxy resin composition of the present invention is provided.

The present invention will be described specifically in the following.

As the epoxy resin of component (A) used in the present invention, monomers, oligomers and polymers having two or more epoxy groups in one molecule in general can be used, and the molecular weight and the molecular structure are not particularly limited. Examples of the epoxy resin include epoxy resins of the bisphenol type such as epoxy resins of the bisphenol A type, epoxy resins of the bisphenol F type and epoxy resins of the brominated bisphenol type; epoxy resins such as epoxy resins of the biphenyl type, epoxy resins of the stilbene type, epoxy resins of the phenol novolak type, epoxy resins of the cresol novolak type, epoxy resins of the naphthalene type, epoxy resins of the dicyclopentadiene type, epoxy resins of the dihydroxybenzene type, epoxy resins of the triphenolmethane type, epoxy resins of the alkyl-modified triphenolmethane type, epoxy resins having triazine nucleus, epoxy resins of the dicyclopentadiene-modified phenol type and epoxy resins of the phenol type and epoxy resins of the phenol aralkyl type (having a skeleton structure of phenylene or biphenylene); epoxy compounds prepared by the reaction of hydroxyl group in a polyfunctional phenol compound with epichlorohydrin; epoxy resins prepared by oxidation of an olefin with a peracid; epoxy resins of the glycidyl ester type; and epoxy resins of the glycidylamine type. The epoxy resin may be used singly or in combination of two or more.

When the resistance to soldering in the semiconductor device is considered, epoxy resins of the phenol aralkyl type having the skeleton structure of biphenylene are preferable among the above epoxy resins. Epoxy resins represented by the following general formula [8] are more preferable.

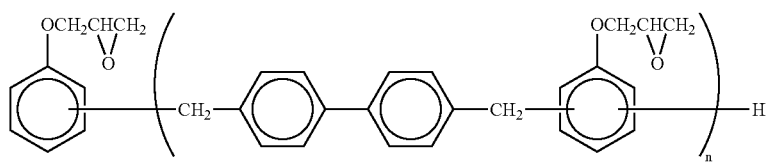

[8]

THE MOST PREFERRED EMBODIMENT TO CARRY OUT THE INVENTION

In accordance with the present invention, since the epoxy resin composition comprises an epoxy resin of component (A), a curing agent of component (B), a curing accelerator of component (C) and a component for retarding curing of the epoxy resin of component (D), latency can be provided to the curing property of the epoxy resin composition, and the In the above general formula [8], n represents an average value which is a positive number of 1 to 10.

The curing agent of component (B) used in the present invention is not particularly limited as long as the curing agent cures the epoxy resin by the reaction with the epoxy resin. Examples of the curing agent include phenol-based resins; bisphenol compounds such as bisphenol A, acid anhydrides such as maleic anhydride, phthalic anhydride and pyromellitic anhydride, and aromatic amines such as metaphenylenediamine, diaminodiphenylmethane and diaminodiphenylsulfone. The curing agent may be used singly or in combination of two or more.

Among these curing agents, phenol-based resins are preferable. As the phenol-based resin used in the present invention, monomers, oligomers and polymers having two or more phenolic hydroxyl groups in one molecule in general can be used, and the molecular weight and the molecular structure are not particularly limited. Examples of the phenol-based resin include phenol novolak resins, cresol novolak resins, phenol resins modified with dicyclopentadiene, phenol resins modified with terpene, resins of the triphenolmethane type and phenol aralkyl resins (having a skeleton structure of phenylene or biphenylene). The phenol-based resin may be used singly or in combination of two or more.

When the resistance to soldering in the semiconductor device is considered, phenol aralkyl resins having the skeleton structure of biphenylene are preferable among the above phenol resins. Phenol resins represented by the following general formula [9] are more preferable.

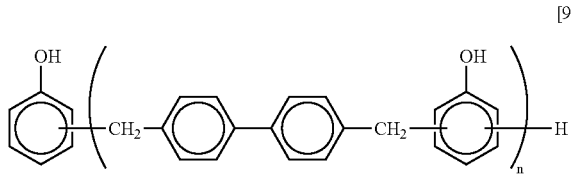

[9]

In the above general formula [9], n represents an average value which is a positive number of 1 to 10.

As for the relative amounts of the epoxy resin and the phenol-based resin of the curing agent, it is preferable that the ratio (Ep|Ph) of the number of the epoxy group (Ep) in the entire epoxy resin to the number of the phenolic hydroxyl group (Ph) in the entire phenol-based resin is 0.8 or greater and 1.3 or smaller. When the above ratio is within the above range, the possibility that a decrease in the curing property of the epoxy resin molding material, lowering of the glass transition temperature of the cured product or deterioration in the reliability under moisture takes place is small.

As for the curing accelerator of component (C) which can be used in the present invention, any compound which accelerates the reaction of the epoxy group in the epoxy resin with the phenolic hydroxyl group in the phenol based resin can be used. Compounds conventionally used for epoxy resin compositions of the encapsulating material for semiconductor elements can be used. Examples of the curing accelerator include compounds having phosphorus atom such as organic phosphines, tetra-substituted phosphonium compounds, phospho-betain compounds and adducts of phosphine compounds with quinone compounds; and compounds having nitrogen atom such as 1,8-diazabicyclo(5.4.0) undecene-, ben.zyldimethylamine and 2-methylimidazole. Among these compounds, compounds having phosphorus atom are preferable. Compounds having a cation portion in the molecule, i.e., compounds having a cation having the function of accelerating the curing reaction of the epoxy resin in the molecule, are more preferable. The form and the type of the cation are not particularly limited. Specifically, the form and the type can be selected, for example, from salts outside the molecule such as halogen salts and salts of organic bases, intra-molecular salts such as betain and complex salts such as molecular compounds.

Examples of the curing accelerator having a cation portion in the molecule include tetra-substituted phosphonium salts such as tetraphenylphosphonium chloride, tetraphenylphosphonium bromide and tetraphenylphosphonium iodide; onium halogen salts such as trimethyl-ammonium bromide and diphenylsulfonium bromide; phosphonium betain compounds such as adducts of triphenylphosphine with 1,4-benzoquinone, 2-(triphenylphosphonio)-phenolate and 3-(triphenylphosphonio)phenolate; ammonium betains such as 1-carboxyl-N,N,N-trimethylmethanaminium intramolecular salts; molecular compounds such as molecular compounds comprising tetraphenylphosphonium and a bisphenol such as bisphenol A and molecular compounds comprising tetrabutylphosphonium and a dihydroxynaphthalene such as 2,3-dihydroxynaphthalene; and quaternary phosphonium salts formed with triphenylphosphine and a phenol compound.

Among these compounds, the tetra-substituted organic phosphorus compounds, i.e., the molecular compounds such as molecular compounds of tetraphenylphosphonium and bisphenols and molecular compounds of tetraphenylphosphonium and dihydroxynaphthalenes, the phosphonium betain compounds such as adducts of triphenylphosphine with 1,4-benzoquinone and 2-(triphenylphosphonio)phenolate and the like, are preferable since the epoxy resin composition exhibits the remarkably excellent curing property and the latency, simultaneously. The phospho-betain compound or the adduct of a phosphine compound with a quinone compound is excellent in decreasing the modulus of a cured product of the epoxy resin composition at high temperatures. The curing accelerator can be used singly or in combination of two or more.

Examples of the organic phosphine include primary phosphines such as ethylphosphine and phenylphosphine, secondary phosphines such as dimethylphosphine and diphenylphosphine and tertiary phosphines such as trimethylphosphine, triethylphosphine, tributylphosphine and triphenylphosphine.

Among the tetra-substituted organic phosphorus compounds which can be used in the present invention, examples of the tetra-substituted phosphonium salt of component (c1) include compounds represented by general formula [4]:

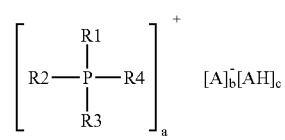

[4]

In the above general formula [4], P represents phosphorus atom, R1, R2, R3 and R4 each represent a substituted or unsubstituted aromatic group or alkyl group and may represent the same group or different groups, A represents an anion of an aromatic organic acid having at least one functional group selected from hydroxyl group, carboxyl group and thiol group on an aromatic ring, AH represents an aromatic organic acid having at least one functional group selected from hydroxyl group, carboxyl group and thiol group on an aromatic ring, a and b each represent an integer which is 1 or greater and 3 or smaller, c represents an integer which is 0 or greater and 3 or smaller, and a=b.

The compound represented by general formula [4] can be obtained, for example, as described in the following. A tetra-substituted phosphonium bromide, an aromatic organic acid and a base are mixed into an organic solvent to form a homogeneous solution, and the anion of the aromatic organic acid is generated in the solution. Then, water is added to the solution, and the compound represented by general formula [4] can be separated by precipitation. As the compound represented by general formula [4], for example, compounds represented by general formula R1 in which the groups represented by R1, R2, R3 and R4 and bonded to the phosphorus atom are phenyl groups, AH represents a compound having hydroxyl group on the aromatic ring, i.e., a phenol, and A represents an anion derived from the phenol, are preferable.

Among the tetra-substituted organic phosphorus compounds which can be used in the present invention, examples of the phospho-betain compound of component (c2) include compounds represented by general formula [5]:

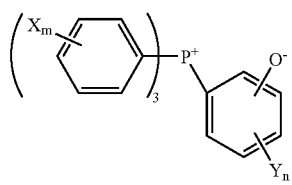

[5]

In the above general formula. [5], X represents hydrogen atom or an alkyl group having 1 to 3 carbon atoms, Y represents hydrogen atom or hydroxyl group, and m and n each represent a integer which is 1 or greater and 3 or smaller.

The compound represented by general formula [5] can be obtained, for example, as described in the following. A tertiary phosphine which is a phosphine substituted with three aromatic groups and a diazonium salt are brought into contact with each other. The compound represented by general formula can be obtained by replacing the phosphine substituted with three aromatic groups with the diazonium group in the diazonium salt. However, the process is not limited to the above process. As the compound represented by general formula [5], for example, compounds represented by general formula [5] in which X represents hydrogen atom or methyl group, and Y represents hydrogen atom or hydroxyl group are preferable.

Among the tetra-substituted organic phosphorus compounds which can be used in the present invention, examples of the adduct of a phosphine compound with a quinone compound of component (c3) include compounds represented by formula [6]:

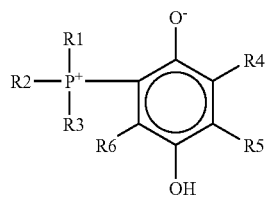

[6]

In the above general formula [6], P represents phosphorus atom, R1 to R3 each represent a substituted or unsubstituted alkyl group having 1 to 12 carbon atoms or a substituted or unsubstituted aryl group having 6 to 12 carbon atoms and may represent the same group or different groups, R4 to R6 each represent hydrogen atom or a hydrocarbon group having 1 to 12 groups, the atom and the groups represented by R4 to R6 may be the same with or different from each other, and the groups represented by R4 and R5 may be bonded to each other to form a cyclic structure.

As the phosphine compound used for the adduct of the phosphine compound with the quinone compound of component (c3), for example, compounds having no substituents on the aromatic ring or having a substituent such as an alkyl group or an alkoxyl group on the aromatic ring such as triphenylphosphine, tris(alkylphenyl)phosphine, tris(alkoxyphenyl)phosphine, trinaphthylphosphine and tris(benzyl)-phosphine are preferable. Examples of the organic group which is an alkyl group or an alkoxyl group include alkyl groups and alkoxyl groups having 1 to 6 carbon atoms. From the standpoint of availability, triphenylphosphine is more preferable.

Examples of the quinone compound used for the adduct of the phosphine compound with the quinone compound of component (c3) include o-benzoquinone, p-benzoquinone, and anthraquinone. Among these compounds, p-benzoquinone is preferable from the standpoint of the storage stability.

As for the process for producing the adduct of the phosphine compound with the quinone compound of component (c3), the adduct can be obtained by bringing the phosphine compound and the quinone compound into contact with each other by mixing both components in a solvent dissolving both components. As the solvent, ketones having a small solubility of the adduct such as acetone and methyl ethyl ketone are preferable. However, the solvent is not limited to the above solvent.

As the compound represented by formula [6], for example, a compound represented by formula [6] in which the groups represented by R1, R2 and R3 and bonded to the phosphorus atom are phenyl groups, and R4, R5 and R6 each represent hydrogen atom, i.e., a compound obtained by addition of 1,4-benzoquinone and triphenylphosphine, is preferable.

In the present invention, conventional curing accelerators can be used as long as the effects exhibited with the tetra-substituted organic phosphorus compound are not adversely affected. Examples of the conventional curing accelerator include compounds having phosphorus atom such as organic phosphines and compounds having nitrogen atom such as 1,8-diazabicyclo(5.4.0)undecene-7, benzyldimethylamine and 2-methylimidazole.

The amount of the tetra-substituted organic phosphorus compound used in the present invention is preferably 0.1% by weight or more and 1% by weight or less based on the amount of the entire epoxy resin composition. When the amount is within the above range, the excellent curing property can be obtained without adversely affecting the fluidity.

As the component for retarding curing of the epoxy resin used in the present invention, components (a) to (c) shown in the following can be used. One of the three components or a combination of two or more of the three components can be used.

(a) An anion component represented by the following general formula [1]:

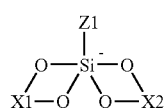

[1]

wherein X1 and X2 each represent an organic group and may represent the same group or different groups, and Z1 represents a substituted or unsubstituted organic group having an aromatic ring or a heterocyclic ring or a substituted or unsubstituted aliphatic group;

(b) A compound represented by the following general formula [2]:

wherein X3 represents an organic group;

(c) A silane compound represented by the following general formula [3]:

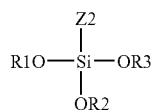

wherein R1, R2 and R8 each represent an aliphatic group having 1 to 3 carbon atom's and may represent the same group or different groups, and Z2 represents a substituted or unsubstituted organic group having an aromatic ring or a heterocyclic ring or a substituted or unsubstituted aliphatic group.

Component (a) which is the anion component represented by general formula [1] has an anionic chelate structure. X1 and X2 in the above general formula [1] each represent an organic group and may represent the same group or different groups, and Z1 represents a substituted or unsubstituted organic group having an aromatic group or a heterocyclic group or a substituted or unsubstituted aliphatic group.

Examples of the organic group represented by X1 and X2 include substituted and unsubstituted aliphatic groups such as ethylene group and methylethylene group and substituted and =substituted aromatic groups such as phenylene group and naphthalene group. Among these groups, 1,2-phenylene group and 2,8-naphthalene group are preferable due to the excellent stability of the chelate structure of component (a) and excellent latency. It is preferable that X1 and X2 represent the same group since the stability of the chelate structure is further increased.

Examples of the organic group having a substitute or unsubstituted aromatic ring or a heterocyclic ring and the substituted or unsubstituted aliphatic group which are represented by Z1 include substituted and unsubstituted aromatic groups such as phenyl group, methylphenyl group, ethylphenyl group and naphthalene group, substituted and unsubstituted heterocyclic groups such as pyridinyl group and substituted and unsubstituted aliphatic groups such as methyl group, ethyl group, propyl group, isopropyl group, butyl group and hexyl group. Among these groups, substituted and unsubstituted aromatic groups and substituted and unsubstituted aliphatic groups having 4 to 8 carbon atoms such as phenyl group and hexyl group are preferable due to the excellent stability of the chelate structure.

In the present invention, component (a) works as the component retarding the curing which suppresses the effect to accelerate curing of the epoxy resin by the curing accelerator having a cation portion in the molecule. However, since the component constituting the chelate ring in the anion component represented by general formula [1] has reactivity with the epoxy resin, the chelate ring is destroyed as the curing reaction proceeds, and the effect to retard the curing is gradually lost. In contrast, conventional components for retarding the curing continues to retard the curing reaction throughout the initial period to the final period of the reaction, and the sufficient property of curing cannot be obtained. In the case of the present component for retarding curing, as opposed to the case of the conventional components for retarding the curing, the reaction is latent only in the initial period of the curing since the effect to retard the curing decreases in the final stage of the curing, and the cured article can be provided rapidly with the sufficient degree of curing.

Component (b) is a compound which can form the ring of a chelate. The compound represented by general formula [2] has an organic group represented by X3. The organic group represented by X3 are as defined for X1 and X2 in general formula [1].

In the present invention, although the effect to improve the fluidity and the filling property of the epoxy resin composition can be exhibited when component (b) is used singly, a greater effect to improve the fluidity and the filling property of the epoxy resin composition can be exhibited when component (b) is used in combination with the anion component represented by general formula [1] due to the synergistic effect. In the process in which the retarding effect of the anion component represented by general formula [1] is lost as the curing proceeds, the compound represented by general formula [2] exhibits the function of regenerating the broken chelate ring. The effect of the anion component represented by general formula [1] to exhibit the latency is exhibited for a longer time than when the curing of the epoxy resin is suppressed with the anion component represented by general formula [1] of component (a) alone due to the effect of the addition of the compound which can form the chelate ring.

As component (b), i.e., the compound represented by general formula [2], compounds in which hydroxyl group is bonded to each of two or more adjacent carbon atoms constituting the aromatic ring are preferable due to the great easiness of regenerating the chelate ring. Examples of the above compound include catechols such as 1,2-dihydroxybenzene (o-catechol, 4-methyl-o-catechol, 4-ethyl-o-catechol, 4-bromo-o-catechol, 5-chloro-o-catechol, 4-nitro-o-catechol, 4-tert-butyl-o-catechol, 4-aminomethyl-o-catechol and 4-hydroxymethyl-o-catechol; naphthalene compounds such as 1,2-dihydroxynaphthalene, 2,3-dihydroxynaphthalene, 7-methyl-2,3-dihydroxynaphthalene and 6-methyl-2,3-dihydroxynaphthalene; pyrogallol compounds such as gallic acid and esters of gallic acid; and derivatives of these compounds. Among these compounds, 2,3-dihydroxynaphthalene is more preferable since the chelate ring tends to be formed more easily, and the effect of the anion component to exhibit the latency can be kept for a longer time.

When component (b) is used in combination with the anion component represented by general formula [1], the relative amounts of the anion component represented by general formula [1] and the compound represented by general formula [2] can be adjusted in accordance with the desired degree of retardation of the curing. Specifically, it is preferable that the amount of the compound represented by general formula. [2] is 0.05 to 5 moles and more preferably 0.5 to 2 moles per 1 mole of the anion component represented by general formula D1. When the relative amounts are within the above range, the balance between the curing property and the effect to exhibit the latency becomes more excellent. When the amount of the compound represented by general formula is excessively great, there is the possibility that the retardation of the curing is excessively great, and the curing property is not sufficiently exhibited. When the amount of the compound represented by general formula [2] is excessively small, there is the possibility that the effect to exhibit the latency is not sufficient. The amount of the compound represented by general formula [2] is preferably 0.01% by weight or more and 1% by weight or less and more preferably 0.02% by weight or more and 0.8% by weight or less based on the amount of the entire epoxy resin composition. When the amount of the compound represented by general formula [2] is within the above range, the fluidity, the filling property and the storage stability can be further improved.

Although the effect to improve the fluidity and the filling property of the epoxy resin composition can be exhibited when component (c) is used singly, a synergistic effect can be exhibited when component (c) is used in combination with component (b), i.e., the compound represented by general formula [2]. The silane compound is a compound represented by general formula [3] in which R1, R2 and R3 each represent an aliphatic group having 1 to 3 carbon atoms and may represent the same group or different groups, and Z2 represents a substituted or unsubstituted organic group having an aromatic ring or a heterocyclic ring or a substituted or unsubstituted aliphatic group.

In the present invention, the silane compound represented by general formula [3] which is component (c) and the compound which can constitute a chelate ring and is represented by general formula [2] can form the anion component represented by general formula [1] as the curing reaction of the epoxy resin composition proceeds. As the result, the latency similar to that described above can be obtained although the method of addition is different.

Examples of the silane compound represented by general formula [8] include silanes having an aromatic substituent group such as phenyltrimethoxysilane, pentyltriethoxysilane, phenyltripropoxysilane and phenyldimethoxyethoxysilane; and silanes having an aliphatic substituent group such as trimethoxyhexylsilane and diethoxymethoxy-octylsilane. Among these, compounds, the phenylsilane compounds represented by formula [7]:

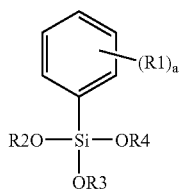

is preferable due to the excellent ability to exhibit the latency. In the above formula. [7], R1 represents hydrogen atom or a hydrocarbon group having 4 or less carbon atoms, R2, R3 and R4 each represent an aliphatic group having 1 to 8 carbon atoms and may represent the same group or different groups, and a represents an integer which is 1 or greater and 5 or smaller. Among the above compounds, phenyltrimethoxysilane and phenyltriethoxysilane are preferable. However, the phenyl silane compound is not particularly limited as long as the compound is represented by formula [7]. The above compounds can be used singly or in combination of two or more.

The amount of component (c) represented by general formula [3] used in the present invention is preferably 0.01% by weight or more and 1% by weight or leas and more preferably 0.05% by weight or more and 0.5% by weight or less based on the amount of the entire epoxy resin composition. When the amount is within the above range, the fluidity, the filling property and the storage stability of the epoxy resin composition can be improved while the sufficient curing property is maintained.

When the compound represented by general formula [2] is used in combination with component (c), the compounds described as the examples of the compound of component (b) can be used as the compound represented by general formula [2]. The compounds described as the examples of the preferable compound of component (b) are also preferable as the compound represented by general formula [2]. Similarly, when the above component (c) is used, the time when the latency is exhibited can be adjusted by adjusting the amount of the compound represented by general formula [2] which can form the chelate ring relative to the amount of the alarm compound represented by general formula [3].

When component (c) is used in combination with component (b), i.e., the compound represented by general formula [2], the relative amounts of the compound represented by general formula [2] and the slime compound represented by general formula [3] can be adjusted in accordance with the desired degree of retardation of the curing. Specifically, it is preferable that the amount of the compound represented by general formula [2] is 1 to 5 moles and more preferably 1 to 2 moles per 1 mole of the silane compound represented by general formula [3]. When the relative amounts are within the above range, the balance between the curing property and the effect to exhibit the latency becomes more excellent. When the amount of the compound represented by general formula [2] is excessively great, there is the possibility that the retardation of the curing is excessively great, and the curing property is not sufficiently exhibited. When the amount of the compound represented by general formula [2] is excessively small, there is the possibility that the sufficient amount of the chelate ring is not formed, and the effect to exhibit the latency is not sufficient.

In epoxy resin composition of the present invention, the content (the added amount) of the component for retarding curing can be adjusted in accordance with the desired degree of latency. Specifically, it is preferable that the component for retarding curing is added in an amount in the range corresponding to 0.1 to 0.5 moles and more preferably 0.5 to 2 moles of the anion in the anion component represented by general formula [1] per 1 mole of the component for acceleratingg the curing. When the relative amounts are within the above range, the balance between the curing property and the effect to exhibit the latency becomes more excellent.

The process for synthesizing the component for retarding curing used in the present invention will be described in the following.

As the component for retarding curing used in the present invention, the anion component represented by general formula [1] or a compound which can form the anion component can be used. For example, the component for retarding curing can be easily obtained by mixing the compound represented by general formula [2] and the compound represented by general formula [8] and heating the resultant mixture. Specifically, the component for retarding curing can be obtained by homogeneously dissolving the compound represented by general formula [2] and the compound represented by general formula [8] into a solvent such as an alcohol, followed by condensation by heating the resultant mixture at 80 to 120° C. under mixing.

The condensation may also be conducted by mixing the above two components separately into the resin composition, followed by achieving the condensation by the heating during the curing reaction so that the anion component represented by general formula [1] is formed within the resin composition.

When the component for retarding curing is not formed within the resin composition, the component for accelerating curing and the component for retarding curing are brought into reaction in advance, and the salt or the complex salt such as the molecular compound formed by the reaction is added. The latter process is preferable since the anion which is the component for retarding curing is surely added to the curing accelerator, and the effect can be exhibited sufficiently by the component for retarding curing.

As the process for synthesizing the salt of the component for accelerating curing and the component for retarding curing, for example, three components which are the onium halogen salt as the curing accelerator having a cation portion in the molecule, the silane compound represented by general formula [3] as component (c) and the compound represented by general formula [2] which can form a chelate ring as component (b) are mixed, in a solvent, and the resultant mixture is neutralized with an alkali hydroxide such as sodium hydroxide to obtain the desired salt.

In the present invention, the effect to exhibit the latency can be obtained similarly by using the tetra-substituted organic phosphorus compound and the phenylsilane compound represented by formula [7] in combination. The tetra-substituted organic phosphorus compound is a latent curing accelerator and exhibits the effect to improve the fluidity, the filling property and the storage stability of the epoxy resin composition when the compound is used singly. When the above compounds are used in combination, the effect to remarkably improve the fluidity, the filling property and the storage stability of the epoxy resin composition can be obtained due to the synergistic effect. When a resin having a relatively great viscosity is used or when an inorganic filler is used in a great amount, the sufficient fluidity, filling property and storage stability are not occasionally obtained by the single use of the tetra-substituted organic phosphorus compound of component (C) or the phenylsilane compound. The excellent fluidity, filling property and storage stability can be obtained by using the tetra-substituted organic phosphorus compound and the phenylsilane compound in combination.

In the present invention, when the epoxy resin and the compound having two or more phenolic hydroxyl groups in one molecular as the curing agent are used, the content (the added amount) of the curing accelerator is not particularly limited. It is preferable that the content is about 0.01 to 10% by weight and more preferably about 0.1 to 5% by weight based on the amount of the epoxy resin composition.

The relative amounts of the epoxy resin composition and the compound having two or more phenolic hydroxyl groups in one molecule are not particularly limited. It is preferable that the compound having two or more phenolic hydroxyl groups in one molecule is used in an amount such that the amount of the phenolic hydroxyl group is about 0.5 to 2 moles and more preferably about 0.7 to 1.5 moles per 1 mole of the epoxy group in the epoxy resin. When the relative amounts are in the above range, the cured product of the epoxy resin composition can have a sufficient strength.

As the inorganic filler which can be used in the present invention, inorganic fillers conventionally used for epoxy resin compositions for encapsulating semiconductors can be used. Examples of the inorganic filler include fused silica, crystalline silica, talc, alumina and silicon nitride. Spherical fused silica is preferable. The inorganic filler may be used singly or in combination of two or more. The content (the added amount) of the inorganic filler is not particularly limited. It is preferable that the amount of the inorganic filler is about 200 to 2,400 parts by weight and more preferably about 400 to 1,400 parts by weight per 100 parts by weight of the resin component comprising the epoxy resin and the curing agent. It is preferable that the content (the added amount) of the inorganic filler is about 70% by weight or more and 96% by weight or less and more preferably about 80% by weight or more and 94% by weight or less based on the amount of the entire epoxy resin composition. When the amount of the inorganic filler is less than the above range, there is the possibility that the reinforcing effect of the inorganic filler is not sufficiently exhibited. When the amount of the inorganic filler exceeds the above range, the fluidity of the epoxy resin composition (the epoxy resin molding material) decreases, and there is the possibility that insufficient filling takes place during molding of the epoxy resin composition (the epoxy resin molding material). In the present invention, the content of the inorganic filler can be increased by adjusting the fluidity using the curing accelerator and the component for retarding curing in a manner such that the excellent fluidity is exhibited. In this case, a semiconductor device exhibiting excellent reliability on the properties such as the resistance to soldering and the reliability under moisture can be obtained due to the effect exhibited with the inorganic filler.

The amount of the inorganic filler may be expressed by the unit of % by volume by conversion from the unit of % by weight based on the specific gravities of the epoxy resin, the curing agent and the inorganic filler.

In the epoxy resin composition of the present invention, a silane coupling agent such as epoxysilanes, mercaptosilanes, aminosilanes, alkylsilanes, ureidosilanes and vinylsilanes can be used, where necessary. Examples of the silane coupling agent include γ-aminopropyltriethoxy-silane, γ-aminopropyltrimethoxysilane, N-β-(aminoethyl)-γ-aminopropyltrimethoxysilane, N-β-(aminoethyl)-γ-aminopropylmethyldimethoxysilane, N-phenyl-γ-aminopropyltriethoxysilane, N-phenyl-γ-aminopropyltrimethoxysilane, N-β-(aminoethyl)-γ-aminopropyltriethoxysilane, N-6-(aminohexyl)-3-aminopropyltrimethoxysilane, N-(3-(trimethoxysilylpropyl)-1,3-benzenedimethanamine, γ-glycidoxypropyltriethoxysilane, glycidoxytrimethoxysilane, γ-glycidoxypropylmethyldimethoxysilane, β-(3,4-epoxycyclohexyl)ethyltrimethoxysilane, γ-mercaptopropyl-trimethoxysilane, methyltrimethoxysilane, γ-ureidopropyltriethoxysilane and vinyltriethoxysilane. Among these silane coupling agents, epoxysilanes, mercaptosilanes and aminosilanes are preferable. As the aminosilane, primary aminosilanes and anilinosilanes are preferable. A greater effect can be exhibited when two or more the silane coupling agents are used in combination. It is preferable that an aminosilane is used in combination with an epoxysilane, a mercaptosilane or a primary aminosilane. It is more preferable that four types of the aflame coupling agents of an epoxysilane, a mercaptosilane, a primary aminosilane and an aminosilane are used in combination. The amount of the silane coupling agent is not particularly limited. It is preferable that the amount of the silane coupling agent is 0.01% by weight or more and 1% by weight or less and more preferably 0.05% by weight or more and 0.8% by weight or less based on the amount of the entire epoxy resin composition. When the amount of the silane coupling agent is within the above range, a further decrease in the viscosity and the effect to improve the fluidity can be expected. The possibility that the curing property decreases is small when the amount is within the above range. The silane coupling agent may be used after being treated for hydrolysis by adding water or, where necessary, an acid or an alkali in advance. The inorganic filler may be treated with the silane coupling agent in advance.

In the epoxy resin composition of the present invention, a mold release may be used, where necessary. As the mold release, conventional mold releases can be used. Examples of the mold release include higher fatty adds, metal salts of higher fatty acids, ester-based waxes and polyethylene-based waxes. The mold release may be used singly or in combination of two or more. Among the above mold releases, polyethylene-based waxes are preferable, and combinations of a polyethylene-based wax and a montanic ester-based wax are more preferable. The amount of the mold release is not particularly limited. It is preferable that the amount of the mold release is 0.05% by weight or more and 3% by weight or less and more preferably 0.1% by weight or more and 1% by weight or less based on the amount of the entire epoxy resin composition.

In the epoxy resin composition of the present invention, an ion trapping agent can be used, where necessary. As the ion trapping agent, conventional ion trapping agents can be used. Examples of the ion trapping agent include hydrotalcites and water-containing oxides of elements selected from magnesium, aluminum, bismuth, titanium and zirconium. Among these ion trapping agents, hydrotalcites are preferable. The amount of the ion trapping agent is not particularly limited. It is preferable that the amount of the ion trapping agent is 0.05% by weight or more and 3% by weight or less and more preferably 0.1% by weight or more and 1% by weight or less based on the amount of the entire epoxy resin composition.

In the epoxy resin composition of the present invention, the silane coupling agents, the mold releases and the ion trapping agents are used where necessary in addition to the main components, i.e., the epoxy resin, the curing agent, the curing accelerator, the component for retarding curing and the inorganic filler. The epoxy resin composition may further suitably comprise other additives, examples of which include coupling agents other than the silane coupling agent such as titanate coupling agents, aluminum coupling agents and aluminum/zirconium coupling agents, coloring agents such as carbon black, additives for decreasing stress such as silicone oils and rubbers, and flame retardants such as brominated epoxy resins, antimony tribromide, aluminum hydroxide, magnesium hydroxide, zinc borate, zinc molybdate and phosphazenes.

The epoxy resin composition of the present invention can be treated, for example, by uniformly mixing the materials using a mixer or the like, followed by melt mixing by heated rolls or a kneader, cooling and pulverization to form an epoxy resin molding material.

For encapsulating various types of electronic parts and producing semiconductor devices using the epoxy resin composition of the present invention, electronic parts such as semiconductor elements are encapsulated by molding with curing in accordance with a conventional process such as the transfer molding, the compression molding and the injection molding. The semiconductor device of the present invention can be obtained in this manner.

The form of the semiconductor device of the present invention is not particularly limited. Examples of the form include SIP (Single Inline Package), HSIP (SIP with Heatsink), ZIP (Zig-zag Inline Package), DIP (Dual Inline Package), SDIP (Shrink Dual Inline Package), SOP (Small Outline Package), SSOP (Shrink Small Outline Package), TSOP (Thin Small Outline Package), SOJ (Small Outline J-leaded Package), QFP (Quad Flat Package), QFP(FP) (QFP Fine Pitch), TQFP (Thin Quad Flat Package), QFJ (PLCC) (Quad Flat J-leaded Package) and BGA (Ball Grid Array).

The semiconductor device obtained as described above exhibits the excellent resistance to soldering and the excellent reliability under moisture.

In the present invention, the epoxy resin composition comprising the component for retarding curing and, in particular, comprising the anion component represented by general formula [1] and the compound represented by general formula [2] is thermally more stable and exhibits the more excellent resistance to soldering and reliability under moisture since the mobility of free ions derived from the component for retarding curing by dissociation during the curing reaction is decreased due to the bulky structure of the anion component.

The most preferred embodiments of the epoxy resin composition and the semiconductor device of the present invention are described in the above. However, the present invention is not limited to those shown as the embodiments.

EXAMPLES

The present invention will be described more specifically in the following.

Compounds C1 to C4 which were used as the curing accelerator and Compounds C5 and C6 which were salts with the component for retarding curing of the present invention and were used as the latent curing accelerator were prepared.

Synthesis of Compound C1

Into a separable flask (the capacity: 200 ml) equipped with a condenser and a stirrer, 13.10 g (0.050 moles) of triphenylphosphine and 102.42 g (0.150 moles) of a phenol aralkyl resin expressed by the following formula [10] were placed, and the resultant mixture was stirred under heating at 100° C. in an oil bath to form a homogeneous solution. After a completely homogeneous solution was obtained, the stirring was continued for 30 minutes. The obtained resinous substance was cooled and pulverized, and 106.3 g of a curing accelerator of Compound C1 was obtained as a powder. Compound C1 was analyzed in accordance with $^1$H-NMR and was confirmed to be an addition product of triphenylphosphine with phenolic hydroxyl group expressed by the following formula [11], which was the object compound. The yield of Compound C1 was 92%.

[10]

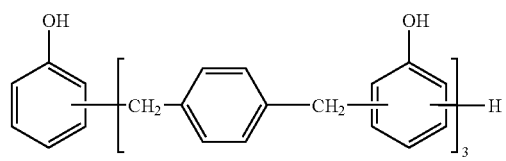

<Physical Properties of the Compound Expressed by Formula [10]>

| | |
|---|---|
| Softening point: | 77° C. |
| Hydroxyl equivalent: | 172 |
| ICI melt viscosity at 150° C.: | 3.6 poises |

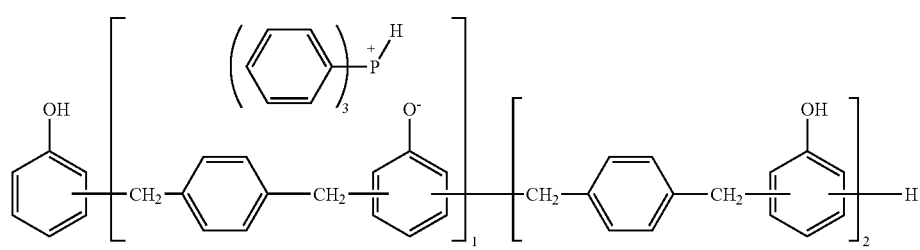

[11]

Synthesis of Compound C2

Into a separable flask (the capacity: 200 ml) equipped with a condenser and a stirrer, 6.49 g (0.060 moles) of benzoquinone, 17.3 g (0.066 moles) of triphenylphosphine and 40 ml of acetone were placed, and the reaction was allowed to proceed at the room temperature under stirring. The separated crystals were washed with acetone, separated by filtration and dried, and 20.0 g of brown crystals were obtained.

The obtained substance was used as Compound C2. Compound C2 was analyzed in accordance with $^1$H-NMR, the mass spectroscopy and the elemental analysis and was confirmed to be a compound expressed by the following formula [12]. The yield of Compound C2 was 84%.

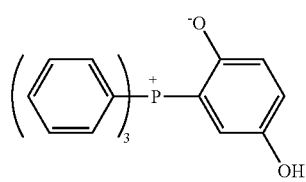

[12]

Synthesis of Compound C3

Into a separable flask (the capacity: 200 ml) equipped with a condenser and a stirrer, 10.4 g (0.060 moles) of 2-bromophenol, 17.3 g (0.066 moles) of triphenylphosphine, 0.65 g mmole) of nickel chloride and 40 ml of ethylene glycol were placed, and the reaction was allowed to proceed by heating at 160° C. under stirring. After the reaction solution was cooled, 40 ml of pure water was slowly added dropwise. The separated powder was washed with toluene, separated by filtration and dried, and a white powder was obtained.

The obtained powder was dissolved into 100 ml of methanol. To the resultant solution, 60 ml of a 1 mole/liter aqueous solution of sodium hydroxide and 500 ml of pure water were successively added. The obtained crystals were separated by filtration and washed, and 12.7 g of light yellow crystals were obtained.

The obtained substance was used as Compound C3. Compound C3 was analyzed in accordance with $^1$H-NMR, the mass spectroscopy and the elemental analysis and was confirmed to be a compound expressed by the following formula [13]. The yield of Compound C3 was 83%.

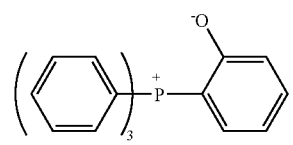

[13]

Synthesis of Compound C4

Into a beaker (the capacity: 1,000 ml) equipped with a stirrer, 25.2 g (0.060 moles) of tetraphenylphosphonium bromide, 27.4 g (0.120 moles) of bisphenol A and 200 ml of methanol were placed. After the solid substances were completely dissolved under stirring, 60 ml of a 1 mole/liter aqueous solution of sodium hydroxide and 600 ml of pure water were successively added. The separated powder was washed with pure water, separated by filtration and dried, and a white powder was obtained.

The obtained substance was used as Compound C4. Compound C4 was analyzed in accordance with $^1$H-NMR, the mass spectroscopy and the elemental analysis and was confirmed to be a phosphonium molecular compound expressed by the following formula [14], which was the object compound. The yield of Compound C4 was 83%.

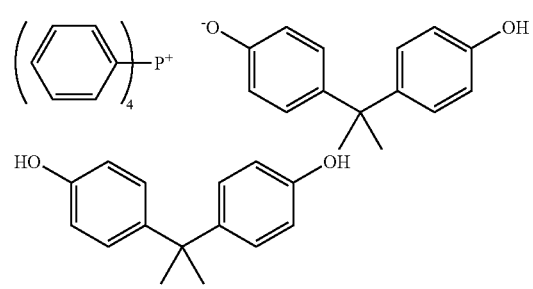

[14]

Synthesis of Compound C5

Into a separable flask (the capacity: 200 ml) equipped with a condenser and a stirrer, 10.4 g (0.060 moles) of 3-bromophenol, 17.3 g (0.066 moles) of triphenylphosphine, 0.65 g (5 mmole) of nickel chloride and 40 ml of ethylene glycol were placed, and the reaction was allowed to proceed by heating at 160° C. under stirring. After the reaction solution was cooled, 40 ml of pure water was slowly added dropwise. The separated crystals were washed with toluene, separated by filtration and dried, and triphenyl(3-hydroxyphenyl)phosphonium bromide was obtained Into a separable flask (the capacity: 200 ml) equipped with a condenser and a stirrer, 7.92 g (0.040 moles) of phenyltrimethoxysilane, 6.40 g (0.040 moles) of 2,3-dihydroxynaphthalene, a solution of sodium hydroxide prepared in advance by dissolving 1.60 g (0.04 moles) of sodium hydroxide into 10 ml of methanol and 50 ml of methanol were placed, and the resultant mixture was stirred to form a homogeneous solution. To the obtained solution, a solution prepared in advance by dissolving 17.4 g (0.04 moles) of triphenyl (3-hydroxyphenyl)phosphonium bromide obtained above into 25 ml of methanol was slowly added dropwise, and crystals were separated. The crystals were obtained by filtration, washed with water and dried in vacuo, and 20.3 g of light reddish white crystals were obtained.

The obtained substance was used as Compound C5. Compound C5 was analyzed in accordance with the mass spectroscopy and the elemental analysis and was confirmed to be a phosphonium silicate expressed by the following formula [15], which was the object compound. The yield of Compound C5 was 75%.

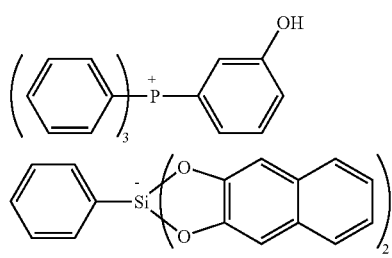

[15]

Synthesis of Compound C6

Into a separable flask (the capacity: 200 ml) equipped with a condenser and a stirrer, 7.92 g (0.040 moles) of phenyltrimethoxysilane, 4.40 g (0.040 moles) of catechol, a solution of sodium hydroxide prepared in advance by dissolving 1.60 g (0.04 moles) of sodium hydroxide into 10 ml of methanol and 50 ml of methanol were placed, and the resultant mixture was stirred to form a homogeneous solution. To the obtained solution, a solution prepared in advance by dissolving 16.8 g (0.040 moles) of tetraphenylphosphonium bromide into 25 ml of methanol was slowly added dropwise, and crystals were separated. The crystals were obtained by filtration, washed with water and dried in vacuo, and 20.4 g of white crystals were obtained.

The obtained substance was used as Compound C6. Compound C6 was analyzed in accordance with $^1$H-NMR, the mass spectroscopy and the elemental analysis and was confirmed to be a phosphonium silicate expressed by the following formula [16], which was the object compound. The yield of Compound C6 was 92%.

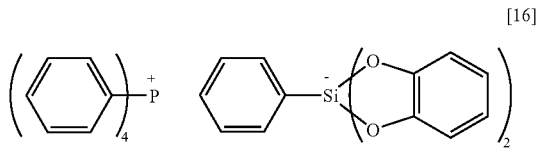

[16]

[Preparation of Epoxy Resin Compositions (Molding Materials)]

Epoxy resin compositions (molding materials) containing Compounds C1 to C6 obtained above were prepared as described in the following.

Examples 1 to 12 and Comparative Example 1

An epoxy resin of the biphenyl type expressed by the following formula [17] [manufactured by JAPAN EPOXY RESIN Co., Ltd.; the trade name: YX-4000HK: the epoxy equivalent: 190; the melting point: 105° C.], a phenol aralkyl resin expressed by the following formula [18] [manufactured by MITSUI KAGAKU Co., Ltd.; the trade name: XLC-LL; the hydroxyl equivalent: 165; the softening point: 79° C.; n=5 in formula [18]], Compound C1 as the curing accelerator, fused spherical silica (the average particle diameter: 15 μm) as the inorganic filler and curing retarders of the present invention shown in Table 1 were used.

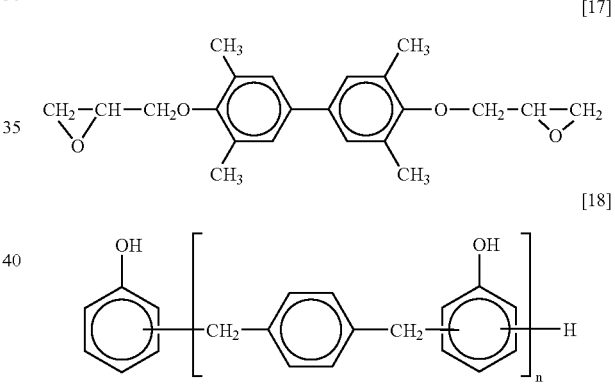

[17]

[18]

The epoxy resin of the biphenyl type in an amount of 52 parts by weight, 48 parts by weight of the phenol aralkyl resin, 8.8 parts by weight of Compound C1, 730 parts by weight of the fused spherical silica and a component for retarding curing in amounts shown in Table 1 were mixed at the room temperature and then at 95° C. for 8 minutes using heated rolls. Mixtures obtained in the manner described above were cooled and pulverized, and epoxy resin compositions (molding materials) were obtained.

TABLE 1

| | Example | | | | | | |
|---|---|---|---|---|---|---|---|
| | 1 | 2 | 3 | 4 | 5 | 6 | 7 |
| Epoxy resin YX-4000HK | 52 | 52 | 52 | 52 | 52 | 52 | 52 |
| Phenol resin XLC-LL | 40.2 | 40.2 | 40.2 | 40.2 | 40.2 | 40.2 | 40.2 |
| Curing accelerator C1 | 8.8 | 8.8 | 8.8 | 8.8 | 8.8 | 8.8 | 8.8 |
| Component for retarding curing | | | | | | | |
| trimethoxyphenylsilane | 0.8 | 0.8 | 0.8 | 0.8 | 0.8 | | |
| trimethoxyhexylsilane | | | | | | 0.8 | 0.8 |

TABLE 1-continued

|  | | | | | | | |
|---|---|---|---|---|---|---|---|
| (3-glycidoxypropyl)trimethoxysilane | | | | | | | |
| (3-mercaptopropyl)trimethoxysilane | | | | | | | |
| Component for retarding curing | | | | | | | |
| 2,3-dihydroxynaphthalene | 0.6 | 1.2 | 3.6 | | | 1.2 | |
| pyrogallol | | | | 0.9 | | | 1.3 |
| catechol | | | | | 0.8 | | |
| Inorganic filler | | | | | | | |
| fused spherical silica | 730 | 730 | 730 | 730 | 730 | 730 | 730 |
| Evaluation of properties | | | | | | | |
| spiral flow (cm) | 83 | 98 | 134 | 96 | 92 | 90 | 108 |
| gel time (s) | 40 | 47 | 59 | 45 | 43 | 42 | 52 |
| torque in curing (N · m) | 7.18 | 7.02 | 6.89 | 7.04 | 7.08 | 7.15 | 6.92 |
| 90 second torque saturation (%) | 89 | 87 | 84 | 87 | 89 | 89 | 81 |
| residual flow (%), in atmosphere, 30° C., 1 week | 78 | 81 | 87 | 80 | 79 | 78 | 83 |
| flow after moisture absorption (cm), 40° C., 60% RH, 48 hours | 80 | 91 | 108 | 87 | 84 | 69 | 72 |

| | Example | | | | | Comparative Example |
|---|---|---|---|---|---|---|
| | 8 | 9 | 10 | 11 | 12 | 1 |
| Epoxy resin YX-4000HK | 52 | 52 | 52 | 52 | 52 | 52 |
| Phenol resin XLC-LL | 40.2 | 40.2 | 40.2 | 40.2 | 40.2 | 40.2 |
| Curing accelerator C1 | 8.8 | 8.8 | 8.8 | 8.8 | 8.8 | 8.8 |
| Component for retarding curing | | | | | | |
| trimethoxyphenylsilane | | | | | | |
| trimethoxyhexylsilane | | | | | | |
| (3-glycidoxypropyl)trimethoxysilane | 0.9 | 0.9 | 0.9 | | | |
| (3-mercaptopropyl)trimethoxysilane | | | | 0.7 | 0.7 | |
| Component for retarding curing | | | | | | |
| 2,3-dihydroxynaphthalene | 1.2 | 3.6 | | | | |
| pyrogallol | | | 0.9 | 0.9 | | |
| catechol | | | | | 1.6 | |
| Inorganic filler | | | | | | |
| fused spherical silica | 730 | 730 | 730 | 730 | 730 | 730 |
| Evaluation of properties | | | | | | |
| spiral flow (cm) | 97 | 128 | 94 | 91 | 114 | 78 |
| gel time (s) | 45 | 56 | 43 | 43 | 54 | 34 |
| torque in curing (N · m) | 7.10 | 6.91 | 7.09 | 7.12 | 6.89 | 7.21 |
| 90 second torque saturation (%) | 88 | 85 | 88 | 88 | 82 | 90 |
| residual flow (%), in atmosphere, 30° C., 1 week | 80 | 85 | 85 | 79 | 84 | 72 |
| flow after moisture absorption (cm), 40° C., 60% RH, 48 hours | 66 | 88 | 64 | 65 | 72 | 53 |

Examples 13 to 24 and Comparative Example 2

Epoxy resin compositions (molding materials) were obtained in accordance with the same procedures as those conducted in Examples 1 to 12 and Comparative Example 1 except that 1 part by weight of Compound C2 as the curing accelerator and components for retarding curing shown in Table 2 in amounts also shown in Table 2 were used.

TABLE 2

| | Example | | | | | | |
|---|---|---|---|---|---|---|---|
| | 13 | 14 | 15 | 16 | 17 | 18 | 19 |
| Epoxy resin YX-4000HK | 52 | 52 | 52 | 52 | 52 | 52 | 52 |
| Phenol resin XLC-LL | 48 | 48 | 48 | 48 | 48 | 48 | 48 |
| Curing accelerator C2 | 1.0 | 1.0 | 1.0 | 1.0 | 1.0 | 1.0 | 1.0 |
| Component for retarding curing | | | | | | | |
| trimethoxyphenylsilane | 0.8 | 0.8 | 0.8 | 0.8 | 0.8 | | |
| trimethoxyhexylsilane | | | | | | 0.8 | 0.8 |
| (3-glycidoxypropyl)trimethoxysilane | | | | | | | |
| (3-mercaptopropyl)trimethoxysilane | | | | | | | |

TABLE 2-continued

| Component for retarding curing | | | | | | | |
|---|---|---|---|---|---|---|---|
| 2,3-dihydroxynaphthalene | 0.6 | 1.2 | 3.6 | | | 1.2 | |
| pyrogallol | | | | 0.9 | | | 1.3 |
| catechol | | | | | 0.8 | | |
| Inorganic filler | | | | | | | |
| fused spherical silica | 730 | 730 | 730 | 730 | 730 | 730 | 730 |
| Evaluation of properties | | | | | | | |
| spiral flow (cm) | 89 | 106 | 144 | 103 | 99 | 97 | 116 |
| gel time (s) | 38 | 44 | 56 | 42 | 40 | 40 | 49 |
| torque in curing (N · m) | 6.09 | 5.96 | 5.85 | 5.98 | 6.01 | 6.07 | 5.87 |
| 90 second torque saturation (%) | 87 | 85 | 82 | 85 | 87 | 87 | 79 |
| residual flow (%), in atmosphere, 30° C., 1 week | 88 | 91 | 98 | 90 | 89 | 88 | 93 |
| flow after moisture absorption (cm), 40° C., 60% RH, 48 hours | 81 | 95 | 119 | 94 | 89 | 65 | 79 |

| | Example | | | | | Comparative Example |
|---|---|---|---|---|---|---|
| | 20 | 21 | 22 | 23 | 24 | 2 |
| Epoxy resin YX-4000HK | 52 | 52 | 52 | 52 | 52 | 52 |
| Phenol resin XLC-LL | 48 | 48 | 48 | 48 | 48 | 48 |
| Curing accelerator C2 | 1.0 | 1.0 | 1.0 | 1.0 | 1.0 | 1.0 |
| Component for retarding curing | | | | | | |
| trimethoxyphenylsilane | | | | | | |
| trimethoxyhexylsilane | | | | | | |
| (3-glycidoxypropyl)trimethoxysilane | 0.9 | 0.9 | 0.9 | | | |
| (3-mercaptopropyl)trimethoxysilane | | | | 0.7 | 0.7 | |
| Component for retarding curing | | | | | | |
| 2,3-dihydroxynaphthalene | 1.2 | 3.6 | | | | |
| pyrogallol | | | 0.9 | 0.9 | | |
| catechol | | | | | 1.6 | |
| Inorganic filler | | | | | | |
| fused spherical silica | 730 | 730 | 730 | 730 | 730 | 730 |
| Evaluation of properties | | | | | | |
| spiral flow (cm) | 104 | 138 | 101 | 98 | 123 | 84 |
| gel time (s) | 42 | 53 | 40 | 40 | 51 | 32 |
| torque in curing (N · m) | 6.03 | 5.87 | 6.02 | 6.04 | 5.85 | 6.12 |
| 90 second torque saturation (%) | 86 | 83 | 86 | 86 | 80 | 88 |
| residual flow (%), in atmosphere, 30° C., 1 week | 90 | 96 | 96 | 89 | 95 | 81 |
| flow after moisture absorption (cm), 40° C., 60% RH, 48 hours | 72 | 82 | 72 | 66 | 78 | 62 |

Examples 25 to 36 and Comparative Example 3

An epoxy resin of the biphenyl aralkyl type expressed by the following formula [19] [manufactured by NIPPON KAYAKU Co., Ltd.; the trade name: NC3000P; the softening point: 58° C.; the epoxy equivalent: 273; n=2.3 in formula [19]], a phenol resin of the biphenyl aralkyl type expressed by the following formula [20] [manufactured by MEIWA KASEI Co., Ltd.; the trade name: MEH-7851SS; the softening point: 65° C.; the hydroxyl equivalent: 204; n=1.6 in formula [20]], Compound C3 as the curing accelerator, fused spherical silica (the average particle diameter: 15 μm) as the inorganic filler and curing retarders of the present invention shown in Table 3 were used.

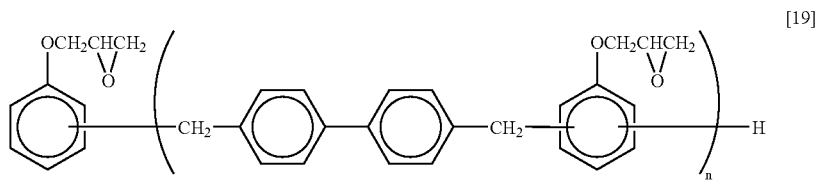

[19]

-continued

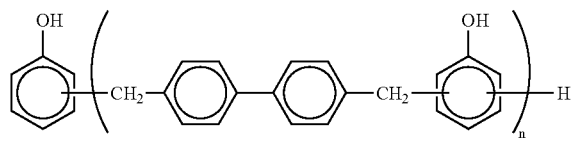

[20]

The epoxy resin of the biphenyl type in an amount of 57 parts by weight, 43 parts by weight of the phenol aralkyl resin, 1 parts by weight of Compound C3, 650 parts by weight of the fused spherical silica and a component for retarding curing in an amount shown in Table 3 were mixed at the room temperature and then at 105° C. for 8 minutes using heated rolls. Mixtures obtained in the manner described above were cooled and pulverized, and epoxy resin compositions (molding materials) were obtained.

TABLE 3

|  | Example ||||||| 
| --- | --- | --- | --- | --- | --- | --- | --- |
|  | 25 | 26 | 27 | 28 | 29 | 30 | 31 |
| Epoxy resin NC-3000 | 57 | 57 | 57 | 57 | 57 | 57 | 57 |
| Phenol resin MEH-7851 | 43 | 43 | 43 | 43 | 43 | 43 | 43 |
| Curing accelerator C3 | 1.0 | 1.0 | 1.0 | 1.0 | 1.0 | 1.0 | 1.0 |
| Component for retarding curing |  |  |  |  |  |  |  |
| trimethoxyphenylsilane | 0.8 | 0.8 | 0.8 | 0.8 | 0.8 |  |  |
| trimethoxyhexylsilane |  |  |  |  |  | 0.8 | 0.8 |
| (3-glycidoxypropyl)trimethoxysilane |  |  |  |  |  |  |  |
| (3-mercaptopropyl)trimethoxysilane |  |  |  |  |  |  |  |
| Component for retarding curing |  |  |  |  |  |  |  |
| 2,3-dihydroxynaphthalene | 0.6 | 1.2 | 3.6 |  |  | 1.2 |  |
| pyrogallol |  |  |  | 0.9 |  |  | 1.3 |
| catechol |  |  |  |  | 0.8 |  |  |
| Inorganic filler |  |  |  |  |  |  |  |
| fused spherical silica | 620 | 620 | 620 | 620 | 620 | 620 | 620 |
| Evaluation of properties |  |  |  |  |  |  |  |
| spiral flow (cm) | 87 | 103 | 141 | 101 | 97 | 95 | 114 |
| gel time (s) | 33 | 39 | 49 | 37 | 35 | 35 | 43 |
| torque in curing (N · m) | 6.97 | 6.82 | 6.69 | 6.83 | 6.87 | 6.94 | 6.72 |
| 90 second torque saturation (%) | 91 | 89 | 86 | 89 | 91 | 91 | 83 |
| residual flow (%), in atmosphere, 30° C., 1 week | 91 | 95 | 100 | 93 | 92 | 91 | 97 |
| flow after moisture absorption (cm), 40° C., 60% RH, 48 hours | 78 | 89 | 110 | 91 | 86 | 64 | 73 |

|  | Example ||||| Comparative Example |
| --- | --- | --- | --- | --- | --- | --- |
|  | 32 | 33 | 34 | 35 | 36 | 3 |
| Epoxy resin NC-3000 | 57 | 57 | 57 | 57 | 57 | 57 |
| Phenol resin MEH-7851 | 43 | 43 | 43 | 43 | 43 | 43 |
| Curing accelerator C3 | 1.0 | 1.0 | 1.0 | 1.0 | 1.0 | 1.0 |
| Component for retarding curing |  |  |  |  |  |  |
| trimethoxyphenylsilane |  |  |  |  |  |  |
| trimethoxyhexylsilane |  |  |  |  |  |  |
| (3-glycidoxypropyl)trimethoxysilane | 0.9 | 0.9 | 0.9 |  |  |  |
| (3-mercaptopropyl)trimethoxysilane |  |  |  | 0.7 | 0.7 |  |
| Component for retarding curing |  |  |  |  |  |  |
| 2,3-dihydroxynaphthalene | 1.2 | 3.6 |  |  |  |  |
| pyrogallol |  |  | 0.9 | 0.9 |  |  |
| catechol |  |  |  |  | 1.6 |  |
| Inorganic filler |  |  |  |  |  |  |
| fused spherical silica | 620 | 620 | 620 | 620 | 620 | 620 |
| Evaluation of properties |  |  |  |  |  |  |
| spiral flow (cm) | 102 | 135 | 99 | 96 | 120 | 82 |
| gel time (s) | 37 | 46 | 35 | 35 | 44 | 28 |
| torque in curing (N · m) | 6.89 | 6.71 | 6.88 | 6.91 | 6.69 | 7.00 |

| TABLE 3-continued | | | | | | |
|---|---|---|---|---|---|---|
| 90 second torque saturation (%) | 90 | 87 | 90 | 90 | 84 | 92 |
| residual flow (%), in atmosphere, 30° C., 1 week | 93 | 99 | 99 | 92 | 98 | 84 |
| flow after moisture absorption (cm), 40° C., 60% RH, 48 hours | 71 | 84 | 71 | 65 | 76 | 57 |

Examples 37 to 48 and Comparative Example 4

Epoxy resin compositions (molding materials) were obtained in accordance with the same procedures as those conducted in Examples 25 to 36 and Comparative Example 3 except that 1 part by weight of Compound C4 as the curing accelerator and components for retarding curing shown in Table 4 in amounts also shown in Table 4 were used.

TABLE 4

| | Example | | | | | | |
|---|---|---|---|---|---|---|---|
| | 37 | 38 | 39 | 40 | 41 | 42 | 43 |
| Epoxy resin NC-3000 | 57 | 57 | 57 | 57 | 57 | 57 | 57 |
| Phenol resin MEH-7851 | 43 | 43 | 43 | 43 | 43 | 43 | 43 |
| Curing accelerator C4 | 1.0 | 1.0 | 1.0 | 1.0 | 1.0 | 1.0 | 1.0 |
| Component for retarding curing | | | | | | | |
| trimethoxyphenylsilane | 0.8 | 0.8 | 0.8 | 0.8 | 0.8 | | |
| trimethoxyhexylsilane | | | | | | 0.8 | 0.8 |
| (3-glycidoxypropyl)trimethoxysilane | | | | | | | |
| (3-mercaptopropyl)trimethoxysilane | | | | | | | |
| Component for retarding curing | | | | | | | |
| 2,3-dihydroxynaphthalene | 0.6 | 1.2 | 3.6 | | | 1.2 | |
| pyrogallol | | | | 0.9 | | | 1.3 |
| catechol | | | | | 0.8 | | |
| Inorganic filler | | | | | | | |
| fused spherical silica | 620 | 620 | 620 | 620 | 620 | 620 | 620 |
| Evaluation of properties | | | | | | | |
| spiral flow (cm) | 84 | 99 | 136 | 97 | 93 | 91 | 109 |
| gel time (s) | 28 | 33 | 42 | 32 | 30 | 30 | 37 |
| torque in curing (N · m) | 8.08 | 7.90 | 7.75 | 7.92 | 7.96 | 8.04 | 7.78 |
| 90 second torque saturation (%) | 91 | 89 | 86 | 89 | 91 | 91 | 83 |
| residual flow (%), in atmosphere, 30° C., 1 week | 80 | 83 | 89 | 82 | 81 | 80 | 85 |
| flow after moisture absorption (cm), 40° C., 60% RH, 48 hours | 75 | 89 | 107 | 87 | 84 | 63 | 71 |

| | Example | | | | | Comparative Example |
|---|---|---|---|---|---|---|
| | 44 | 45 | 46 | 47 | 48 | 4 |
| Epoxy resin NC-3000 | 57 | 57 | 57 | 57 | 57 | 57 |
| Phenol resin MEH-7851 | 43 | 43 | 43 | 43 | 43 | 43 |
| Curing accelerator C4 | 1.0 | 1.0 | 1.0 | 1.0 | 1.0 | 1.0 |
| Component for retarding curing | | | | | | |
| trimethoxyphenylsilane | | | | | | |
| trimethoxyhexylsilane | | | | | | |
| (3-glycidoxypropyl)trimethoxysilane | 0.9 | 0.9 | 0.9 | | | |
| (3-mercaptopropyl)trimethoxysilane | | | | 0.7 | 0.7 | |
| Component for retarding curing | | | | | | |
| 2,3-dihydroxynaphthalene | 1.2 | 3.6 | | | | |
| pyrogallol | | | 0.9 | 0.9 | | |
| catechol | | | | | 1.6 | |
| Inorganic filler | | | | | | |
| fused spherical silica | 620 | 620 | 620 | 620 | 620 | 620 |
| Evaluation of properties | | | | | | |
| spiral flow (cm) | 98 | 130 | 95 | 92 | 115 | 79 |
| gel time (s) | 32 | 40 | 30 | 30 | 38 | 24 |
| torque in curing (N · m) | 7.99 | 7.77 | 7.98 | 8.01 | 7.75 | 8.11 |
| 90 second torque saturation (%) | 90 | 87 | 90 | 90 | 84 | 92 |

TABLE 4-continued

| | | | | | | |
|---|---|---|---|---|---|---|
| residual flow (%), in atmosphere, 30° C., 1 week | 82 | 87 | 87 | 81 | 86 | 74 |
| flow after moisture absorption (cm), 40° C., 60% RH, 48 hours | 70 | 82 | 70 | 67 | 71 | 60 |

Examples 49 to 56 and Comparative Example 5

Epoxy resin compositions (molding materials) were obtained in accordance with the same procedures as those conducted in Examples 37 to 48 and Comparative Example 4 except that 8 parts by weight of Compound C5 or C6, 2 parts by weight of tetraphenylphosphonium tetraphenylborate as the conventional latent curing accelerator and a component for retarding curing shown in Table 5 in amounts also shown in Table 5 were used as a salt of the curing accelerator and the component for retarding curing in place of the curing accelerator and the component for retarding curing which were used separately.

175° C., a pressure of injection of 6.8 MPa and a curing time of 2 minutes, and the length of flow was measured.

The spiral flow is a parameter showing the fluidity. The greater the value, the better the fluidity.

(2) Torque in Curing and 90 Second Torque Saturation

Using CURASTOMETER (manufactured by ORIENTEC Co., Ltd.; JSR CURASTOMETER IV PS type), the torque after 45 seconds at 175° C. was measured.

The greater the value of the torque in curing, the better the curing property.

Using afore-said CURASTOMETER, torque in curing was measured at 90 second and 300 second after the initiation

TABLE 5

| | Example | | | | | | | | Comparative Example |
|---|---|---|---|---|---|---|---|---|---|
| | 49 | 50 | 51 | 52 | 53 | 54 | 55 | 56 | 5 |
| Epoxy resin NC-3000 | 57 | 57 | 57 | 57 | 57 | 57 | 57 | 57 | 57 |
| Phenol resin MEH-7851 | 43 | 43 | 43 | 43 | 43 | 43 | 43 | 43 | 43 |
| Curing accelerator | | | | | | | | | |
| C5 | 3.0 | 3.0 | 3.0 | 3.0 | | | | | |
| C6 | | | | | 3.0 | 3.0 | 3.0 | 3.0 | |
| Conventional accelerator | | | | | | | | | |
| tetraphenylphosphonium tetraphenyl-borate | | | | | | | | | 3.0 |
| Component for retarding curing | | | | | | | | | |
| 2,3-dihydroxynaphthalene | | 0.6 | | | | 0.6 | 1.2 | | |
| pyrogallol | | | 0.9 | 1.8 | | | | 0.9 | |
| Inorganic filler | | | | | | | | | |
| fused spherical silica | 620 | 620 | 620 | 620 | 620 | 620 | 620 | 620 | 620 |
| Evaluation of properties | | | | | | | | | |
| spiral flow (cm) | 101 | 112 | 111 | 146 | 98 | 107 | 134 | 105 | 142 |
| gel time (s) | 46 | 50 | 49 | 63 | 42 | 48 | 58 | 45 | 64 |
| torque in curing (N · m) | 6.22 | 6.18 | 6.21 | 5.92 | 7.28 | 7.19 | 7.10 | 7.22 | 4.14 |
| 90 second torque saturation, (%) | 88 | 86 | 87 | 74 | 87 | 86 | 80 | 87 | 55 |
| residual flow (%), in atmosphere, 30° C., 1 week | 84 | 87 | 86 | 91 | 82 | 85 | 90 | 84 | 89 |
| flow after moisture absorption, (cm), 40° C., 60% RH, 48 hours | 81 | 94 | 102 | 122 | 68 | 87 | 90 | 86 | 64 |

[Evaluation of Physical Properties]

The properties of the epoxy resin compositions (molding materials) obtained in Examples and Comparative Examples were evaluated in accordance with the methods shown in (1) to (4) in the following.

(1) Spiral Flow

Using a low pressure transfer molding machine, an epoxy resin composition (a molding material) was injected into a mold for measuring the spiral flow in accordance with EMMI-1-66 under the condition of a mold temperature of of heating, respectively, and 90 second torque saturation was calculated according to the following equation:

90 second torque saturation=(torque in curing after 90 second)/(torque in curing after 300 second)

90 second torque saturation is a parameter of curing property and the greater the value of 90 second torque saturation, the better the curing property.

(3) Residual Flow

The spiral flow was measured in accordance with the same procedures as those described above in (1) after an epoxy resin composition (a molding material) was stored in the atmosphere at 30° C. for one week, and the fraction by percentage (%) based on the value obtained immediately after being prepared was obtained.

The greater the value of the residual flow, the better the storage property.

The spiral flow was measured in accordance with the same procedures as those described above in (1) after an epoxy resin composition (a molding material) was treated for moisture absorption in a vessel kept at a constant temperature of 40° C. and a constant humidity of 60% RH for 48 hours, and the flow after moisture absorption (cm) was obtained.

Similarly, the greater the above value of the flow, the better the storage property under a humid condition.

(4) Gel Time

An obtained epoxy resin composition (a molding material) was melted on a heated plate at 180° C. The melted composition was mixed by a spatula, and the time before the melted composition lost fluidity (the gel time; the unit: second) was measured.

As shown in Tables 1 to 4, the epoxy resin compositions (the molding materials) obtained in Examples (the epoxy resin compositions (the molding materials) of the present invention) showed improved fluidity and storage property without great adverse effects on the torque in curing in comparison with those of the resin compositions (the molding materials) obtained in Comparative Examples in accordance with the conventional process using a curing accelerator alone.

By adjusting the amount of the component for retarding curing, the fluidity and the storage property were successfully adjusted while the practically sufficient curing property was maintained.

As shown in Table 5, when the curing accelerator and the component for retarding curing were added as the salt, the excellent curing property, fluidity and storage property could be exhibited without using other components for retarding curing. In Comparative Example 5 in which a conventional latent curing accelerator was used, problems arose in that the curing behavior was very slow and the torque in curing was not sufficiently saturated although the fluidity and the storage property were improved.

The fluidity and the storage property could be adjusted while the practically sufficient curing property was maintained by adding the component for retarding curing further.

Examples 57 to 60 and Comparative Examples 6 and 7

Preparation of Materials for Encapsulating Semiconductors

Epoxy resin compositions (molding materials) containing Compound C1 obtained above were prepared as shown in the following.

An epoxy resin of the biphenyl type [manufactured by JAPAN EPOXY RESIN Co., Ltd.; the trade name: YX-4000HK] in an amount of 52 parts by weight of Compound C1 and fused spherical silica and a component for retarding curing in amounts shown in Table 6 were mixed at the room temperature and then at 95° C. for 8 minutes using heated rolls. Mixtures obtained in the manner described above were cooled and pulverized, and epoxy resin compositions (molding materials) of Examples 57 to 60 and Comparative Examples 5 and 6 were obtained.

Using the above epoxy resin compositions (molding materials) as the resin for molding, 8 packages of 100 pin TQFP (semiconductor devices) and 15 packages of 16 pin DIP (semiconductor devices) were prepared.

The package of 100 pin TQFP was prepared by transfer molding under the condition of a mold temperature of 175° C., an injection pressure of 7.4 MPa and a cure time of 2 minutes, followed by post-curing at 175° C. for 8 hours.

The package of 100 pin TQFP had a size of 14×14 mm and a thickness of 1.4 mm. The size of the silicon chip (the semiconductor element) was 8.0×8.0 mm, and the lead frame was made of the 42 alloy.

The package of 16 pin DIP was prepared by transfer molding under the condition of a mold temperature of 175° C., a injection pressure of 6.8 MPa and a cure time of 2 minutes, followed by post-curing at 175° C. for 8 hours.

The package of 16 pin DIP had a size of 6.4×19.8 mm and a thickness of 3.5 mm. The size of the silicon chip (the semiconductor element) was 3.5×3.5 mm, and the lead frame was made of the 42 alloy.

[Evaluation of Properties of Semiconductor Devices]

The properties of the semiconductor devices obtained in Examples 67 to 60 and Comparative. Examples 6 and 7 were evaluated in accordance with the methods shown in (5) to (8) in the following.

(5) Spiral Flow

Using a low pressure transfer molding machine, an epoxy resin composition (a molding material) was injected into a mold for measuring the spiral flow in accordance with EMMI-I-66 under the condition of a mold temperature of 175° C., a pressure of injection of 6.8 MPa and a curing time of 2 minutes, and the length of flow was measured.

The spiral flow is a parameter showing the fluidity. The greater the value, the better the fluidity.

(6) Torque in Curing

Using CURASTOMETER (manufactured by ORIENTEC Co., Ltd.; JSR CURASTOMETER IV PS type), the torque after 45 seconds at 175° C. was measured.

The greater the value of the torque in curing, the better the curing property.

(7) Resistance to Soldering

A package of 100 pin TQFP was left standing in an environment of 85° C. and 85% relative humidity for 168 hours and then dipped into a solder tank at 260° C. for 10 seconds.

Thereafter, the presence or the absence of external cracks was examined by observation by a microscope. The degree of crack formation was obtained as (the number of packages having cracks)/(the total number of the packages)×100 and expressed by the percentage (%).

The degree of cleavage by area between the silicon chip and the cured product of the epoxy resin composition was measured using an ultrasonic defect inspector, and the degree of cleavage was obtained as (the area of cleavage)/(the area of the silicon chip)×100. The average of the values on 8 packages was obtained and expressed by the percentage (%).

The smaller the values of the degree of crack formation and the degree of cleavage, the better the resistance to soldering.

(8) Reliability Under Moisture

A voltage of 20 V was applied to a package of 16 pin DIP in a water vapor at a temperature of 125° C. and a relative humidity of 100%, and the defect due to broken wire was examined. The time before the defect was found in 8 or more packages among 15 packages was used as the defect time.

The maximum time of the measurement was set at 500 hours. When the number of the defect packages was smaller than 8, the defect time is expressed as "exceeding 500 hours" (>500).

The greater the defect time, the better the reliability under moisture.

The results of the evaluations in (6) to (8) are shown in Table 6.

TABLE 6

|  | Example | | | | Comparative Example | |
| --- | --- | --- | --- | --- | --- | --- |
|  | 57 | 58 | 59 | 60 | 6 | 7 |
| Epoxy resin YX-4000HK | 52 | 52 | 52 | 52 | 52 | 52 |
| Phenol resin XLC-LL | 40.2 | 40.2 | 40.2 | 40.2 | 40.2 | 40.2 |
| Curing accelerator C1 | 8.8 | 8.8 | 8.8 | 8.8 | 8.8 | 8.8 |
| Component for retarding curing | | | | | | |
| trimethoxyphenylsilane | 0.8 | | | | | |
| trimethoxyhexylsilane | | 0.8 | | | | |
| (3-glycidoxypropyl)trimethoxysilane | | | 0.9 | 0.9 | | |
| Component for retarding curing | | | | | | |
| 2,3-dihydroxynaphthalene | 1.2 | | 1.2 | 3.6 | | |
| pyrogallol | | 1.3 | | | | |
| Inorganic filler | | | | | | |
| fused spherical silica | 800 | 800 | 800 | 820 | 730 | 800 |
| Evaluation of properties | | | | | | |
| spiral flaw (cm) | 84 | 91 | 86 | 76 | 78 | 33 |
| torque in curing (N · m) | 8.42 | 8.30 | 8.52 | 9.23 | 7.21 | 8.75 |
| resistance to soldering (number of cracks at the outside, %) | 0 | 0 | 0 | 0 | 20 | 5 |
| resistance to soldering (degree of cleavage, %) | 0 | 0 | 0 | 0 | 5 | 5 |
| reliability under moisture (hr) | >500 | >500 | >500 | >500 | 480 | >500 |

As shown in Table 6, the epoxy resin compositions (the molding materials) obtained in Examples 57 to 60 all showed excellent fluidity, and the amount of the inorganic filler could be increased. As the result, the resistance to soldering and the reliability under moisture which showed the reliability of the package in the encapsulating of the semiconductor element were excellent.

In contrast, in Comparative Example 6, the amount of the inorganic filler was decreased so that sufficient fluidity could be obtained, and the sufficient reliability of the package was not obtained. In Comparative Example 7, the reliability of the package could be improved due to the increase in the amount of the inorganic filler. However, the fluidity was very poor, and the composition could not be used as the resin for molding in the practical applications.

Example 61

The above components were mixed by a mixer, further mixed by heated rolls at 95° C. for 8 minutes, cooled and pulverized, and an epoxy resin molding material was obtained. The properties of the obtained epoxy resin molding material were evaluated in accordance with the following methods. The results are shown in Table 7.

[Methods of Evaluation]

(1) Spiral Flow

Using a low pressure transfer molding machine, an epoxy resin composition (a molding material) was injected into a mold for measuring the spiral flow in accordance with EMMI-1-66 under the condition of a mold temperature of 175° C., a pressure of injection of 6.9 MPa and a curing time of 120 seconds, and the length of flow was measured and expressed by the unit of mm

| | |
| --- | --- |
| Epoxy resin 1: an epoxy resin of the phenol aralkyl type [manufactured by NIPPON KAYAKU Co., Ltd.; the trade name: NC3000P] | 7.40 parts by weight |
| Phenol resin 1: a phenol aralkyl resin having the skeleton structure of biphenylene [manufactured by MEIWA KASEI Co., Ltd.; the trade name: MEH-7851SS] | 5.00 parts by weight |
| Phenyltrimethoxysilane | 0.20 parts by weight |
| 2,3-Dihydroxynaphthalene | 0.20 parts by weight |
| Curing accelerator: an adduct of triphenylphosphine with 1,4-benzoquinone | 0.20 parts by weight |
| Fused spherical silica (the average particle diameter: 30 μm) | 86.00 parts by weight |
| Coupling agent 1: γ-gylcidoxypropyltrimethoxysilane | 0.10 part by weight |
| Coupling agent 2: N-phenyl-γ-aminopropyltrimethoxysilane | 0.10 part by weight |
| Mold release 1: a polyethylene-based wax | 0.20 parts by weight |
| Mold release 2: a montanic ester-based wax | 0.10 part by weight |
| Ion trapping agent: hydrotalcite [manufactured by KYOWA KAGAKU KOGYO Co., Ltd.; DHT-4H] | 0.20 parts by weight |
| Carbon black | 0.30 parts by weight |

(2) Curing Property (Torque Ratio in Curing).

Using CURASTOMETER (manufactured by ORIENTEC Co., Ltd.; the JSR CURASTOMETER IV PS type), torque was measured. A value obtained by dividing the torque after 60 seconds at 175° C. by the torque after 300 seconds was used. The greater the value, the better the curing property. The value is expressed by the unit of %.

(3) Storage Stability

A value obtained by dividing the spiral flow obtained after an epoxy resin composition (a molding material) was left standing at 30° C. for one week by the spiral flow in the initial condition was used. The greater the value, the better the storage stability. The value is expressed by the unit of %.

(4) Filling Property (Presence or Absence of Voids)

Using a low pressure transfer molding machine, a package of 160 pQFP was formed under the condition of a temperature of molding of 175° C., a pressure of 9.8 MPa and a cure time of 120 seconds. The obtained product was observed by an ultrasonic defect inspector, and the presence or the absence of internal voids was examined.

good: no voids found
fair: voids found at some portions
poor: voids found in the entire area of the package (5) Resistance to Soldering Using a low pressure transfer molding machine, a package of 80 pQFP (a Cu frame, the size of the chip: 6.0 mm×6.0 mm) was formed under the condition of a temperature of molding of 175° C., a pressure of 8.3 MPa and a cure time of 120 seconds and treated by heating at 175° C. for 8 hours for the after-baking. The package was treated with moisture under a relative humidity of 85% for 120 hours and then treated by the IR reflow at 260° C. The inside of the package was examined by an ultrasonic defect inspector on cleavages and cracks, and a package having either a cleavage or a crack was decided to be defect. The number of the defect package among the evaluated 10 packages is shown.

Examples 62 to 78 and Comparative Examples 8 to 12

Epoxy resin compositions were prepared in accordance with the same procedures as those conducted in Example 61 using the formulations shown in Tables 7, 8 and 9 and evaluated in accordance with the same methods as those used in Example 61. The results of the evaluation are shown in Tables 7, 8 and 9.

Components other than those used in Example 61 are shown in the following.

Epoxy resin 2: an epoxy resin of the biphenyl type [manufactured by JAPAN EPOXY RESIN Co., Ltd.; the trade name: YX-4000HK]

Phenol resin 2: a phenol aralkyl resin [manufactured by MITSUI KAGAKU Co., Ltd.; the trade name: XLC-LL]

Phenyltriethoxysilane
Catechol
Pyrogallol

TABLE 7

| | Example | | | | | | |
| --- | --- | --- | --- | --- | --- | --- | --- |
| | 61 | 62 | 63 | 64 | 65 | 66 | 67 |
| Epoxy resin 1 | 7.40 | 7.00 | 7.50 | 7.00 | 7.40 | | 8.00 |
| Epoxy resin 2 | | | | | | 6.30 | |
| Phenol resin 1 | 5.00 | 4.70 | 5.10 | 4.70 | 5.00 | 6.10 | |
| Phenol resin 2 | | | | | | | 4.40 |
| Phenyltrimethoxysilane | 0.20 | 0.20 | 0.20 | 0.90 | 0.03 | 0.20 | 0.20 |
| 2,3-Dihydroxynaphthalene | 0.20 | 0.90 | 0.02 | 0.20 | 0.20 | 0.20 | 0.20 |
| Curing accelerator | 0.20 | 0.20 | 0.20 | 0.20 | 0.20 | 0.20 | 0.20 |
| Fused spherical silica | 86.00 | 86.00 | 86.00 | 86.00 | 86.00 | 86.00 | 86.00 |
| Coupling agent 1 | 0.10 | 0.10 | 0.10 | 0.10 | 0.10 | 0.10 | 0.10 |
| Coupling agent 2 | 0.10 | 0.10 | 0.10 | 0.10 | 0.10 | 0.10 | 0.10 |
| Mold release 1 | 0.20 | 0.20 | 0.20 | 0.20 | 0.20 | 0.20 | 0.20 |
| Mold release 2 | 0.10 | 0.10 | 0.10 | 0.10 | 0.10 | 0.10 | 0.10 |
| Ion trapping agent | 0.20 | 0.20 | 0.20 | 0.20 | 0.20 | 0.20 | 0.20 |
| Carbon black | 0.30 | 0.30 | 0.30 | 0.30 | 0.30 | 0.30 | 0.30 |
| Spiral flow (cm) | 103 | 110 | 97 | 108 | 100 | 103 | 105 |
| Torque ratio in curing (%) | 87 | 84 | 89 | 91 | 81 | 87 | 86 |
| Storage stability (%) | 89 | 86 | 87 | 92 | 85 | 84 | 87 |
| Filling property | good | good | good | good | good | good | good |
| Resistance to soldering (number of defect in 10 pieces) | 0 | 0 | 0 | 0 | 0 | 0 | 0 |

TABLE 8

| | Example | | | | | |
| --- | --- | --- | --- | --- | --- | --- |
| | 68 | 69 | 70 | 71 | 72 | 73 |
| Epoxy resin 1 | 9.80 | 6.20 | 7.40 | 7.40 | 7.40 | 7.40 |
| Phenol resin 1 | 6.60 | 4.20 | 5.00 | 5.00 | 5.00 | 5.00 |
| Phenyltrimethoxysilane | 0.20 | 0.20 | 0.20 | 0.20 | | 0.10 |
| Phenyltriethoxysilane | | | | | 0.20 | 0.10 |
| 2,3-Dihydroxynaphthalene | 0.20 | 0.20 | | | 0.20 | 0.20 |
| Catechol | | | 0.20 | | | |
| Pyrogallol | | | | 0.20 | | |
| Curing accelerator | 0.20 | 0.20 | 0.20 | 0.20 | 0.20 | 0.20 |
| Fused spherical silica | 82.00 | 88.00 | 86.00 | 86.00 | 86.00 | 86.00 |

TABLE 8-continued

| | Example | | | | | |
|---|---|---|---|---|---|---|
| | 68 | 69 | 70 | 71 | 72 | 73 |
| Coupling agent 1 | 0.10 | 0.10 | 0.10 | 0.10 | 0.10 | 0.10 |
| Coupling agent 2 | 0.10 | 0.10 | 0.10 | 0.10 | 0.10 | 0.10 |
| Mold release 1 | 0.20 | 0.20 | 0.20 | 0.20 | 0.20 | 0.20 |
| Mold release 2 | 0.10 | 0.10 | 0.10 | 0.10 | 0.10 | 0.10 |
| Ion trapping agent | 0.20 | 0.20 | 0.20 | 0.20 | 0.20 | 0.20 |
| Carbon black | 0.30 | 0.30 | 0.30 | 0.30 | 0.30 | 0.30 |
| Spiral flow (cm) | 127 | 93 | 102 | 105 | 99 | 104 |
| Torque ratio in curing (%) | 85 | 87 | 87 | 87 | 86 | 87 |
| Storage stability (%) | 91 | 84 | 87 | 88 | 85 | 90 |
| Filling property | good | good | good | good | good | good |
| Resistance to soldering (number of defect in 10 pieces) | 0 | 0 | 0 | 0 | 0 | 0 |

TABLE 9

| | Comparative Example | | | | |
|---|---|---|---|---|---|
| | 8 | 9 | 10 | 11 | 12 |
| Epoxy resin 1 | 7.50 | 7.50 | 7.50 | 7.50 | 7.40 |
| Epoxy resin 2 | | | | | |
| Phenol resin 1 | 5.10 | 5.10 | 5.10 | 5.10 | 5.00 |
| Phenyltrimethoxysilane | 0.20 | | | | |
| Phenyltriethoxysilane | | 0.20 | | | |
| 2,3-Dihydroxynaphthalene | | | 0.20 | | 0.20 |
| Catechol | | | | 0.20 | |
| Curing accelerator | 0.20 | 0.20 | 0.20 | 0.20 | 0.20 |
| Fused spherical silica | 86.00 | 86.00 | 86.00 | 86.00 | 86.00 |
| Coupling agent 1 | 0.10 | 0.10 | 0.10 | 0.10 | 0.20 |
| Coupling agent 2 | 0.10 | 0.10 | 0.10 | 0.10 | 0.20 |
| Mold release 1 | 0.20 | 0.20 | 0.20 | 0.20 | 0.20 |
| Mold release 2 | 0.10 | 0.10 | 0.10 | 0.10 | 0.10 |
| Ion trapping agent | 0.20 | 0.20 | 0.20 | 0.20 | 0.20 |
| Carbon black | 0.30 | 0.30 | 0.30 | 0.30 | 0.30 |
| Spiral flow (cm) | 81 | 78 | 82 | 78 | 83 |
| Torque ratio in curing (%) | 83 | 83 | 82 | 83 | 87 |
| Storage stability (%) | 70 | 72 | 75 | 78 | 80 |
| Filling property | fair | good | poor | poor | fair |
| Resistance to soldering (number of defect in 10 pieces) | 2 | 3 | 0 | 2 | 0 |

Examples 61 to 73 were in accordance with the present invention, and the type and the amount of the phenylsilane compound, the type and the amount of the compound in which hydroxyl groups were bonded to each of adjacent two or more carbon atoms constituting an aromatic ring, the type of the resin or the amount of the inorganic filler was changed. In all cases, the spiral flow was sufficiently long, and the excellent fluidity was obtained; the torque in curing was great, and the excellent curing property was obtained; the retention of the spiral flow after storage at 30° 0 one week was sufficiently great, and the excellent storage stability was obtained; voids were not found, and the excellent filling property was obtained; and cleavages or cracks were not found in the IR reflow treatment after being treated under moisture, and the excellent resistance to soldering was obtained.

On the other hand, in Comparative Examples 8 and 9, the compound in which hydroxyl groups were bonded to each of adjacent two or more carbon atoms constituting an aromatic ring was not used, and the fluidity, the storage stability and the resistance to soldering were poor. In Comparative Examples 10, 11 and 12, the phenylsilane compound was not used, and the fluidity, the storage stability and the filling property were poor.

As described above, in Examples in accordance with the present invention, epoxy resin compositions (molding materials) for encapsulating semiconductors which exhibited the excellent storage stability, the excellent fluidity and curing property in the encapsulating by molding of semiconductor elements and the excellent resistance to soldering without forming any cleavages or cracks in the soldering treatment at high temperatures corresponding to the lead-free solder, could be obtained.

Example 74

| | |
|---|---|
| Epoxy resin 1: an epoxy resin of the phenol aralkyl type having the skelton structure of biphenylene [manufactured by NIPPON KAYAKU Co., Ltd.; the trade name: NC3000P] | 7.40 parts by weight |
| Phenol resin 1: a phenol aralkyl resin having the skeleton structure of biphenylene [manufactured by MEIWA KASEI Co., Ltd.; the trade name: MEH-7851SS] | 5.00 parts by weight |
| Curing accelerator 1: an adduct of triphenylphosphine with 1,4-benzoquinone | 0.20 parts by weight |
| Phenyltrimethoxysilane | 0.20 parts by weight |
| Fused spherical silica (the average particle diameter: 30 µm) | 86.00 parts by weight |
| 1,2-Dihydroxynaphthalene | 0.20 parts by weight |
| Coupling agent 1: γ-gylcidoxypropyltrimethoxysilane | 0.10 part by weight |
| Coupling agent 2: N-phenyl-γ-aminopropyltrimethoxysilane | 0.10 part by weight |
| Mold release 1: a polyethylene-based wax | 0.20 parts by weight |
| Mold release 2: a montanic ester-based wax | 0.10 part by weight |
| Ion trapping agent: hydrotalcite [manufactured by KYOWA KAGAKU KOGYO Co., Ltd.; DHT-4H] | 0.20 parts by weight |
| Carbon black | 0.30 parts by weight |

The above components were mixed by a mixer, further mixed by heated rolls at 95° C. for 8 minutes, cooled and pulverized, and an epoxy resin molding material was obtained. The properties of the obtained epoxy resin molding material were evaluated in accordance with the same methods as those used in Examples 61 to 73 and Comparative Examples 8 to 12. The results are shown in Table 10.

Examples 75 to 88 and Comparative Examples 13 to 17

Epoxy resin molding materials were prepared in accordance with the same procedures as those conducted in Example 74 using the formulations shown in Tables 10, 11 and 12 and evaluated in accordance with the same methods as those used in Example 74. The results of the evaluation are shown in Tables 10, 11 and 12.

Components other than those used in Example 74 are shown in the following.

Epoxy resin 2: an epoxy resin of the biphenyl type [manufactured by JAPAN EPOXY RESIN Co., Ltd.; the trade name: YX-4000HK]

Phenol resin 2: A phenol aralkyl resin [manufactured by MITSUI KAGAKU Co., Ltd.; the trade name: RLC-LL]

Curing accelerator 2: a curing accelerator expressed by the following formula [21]:

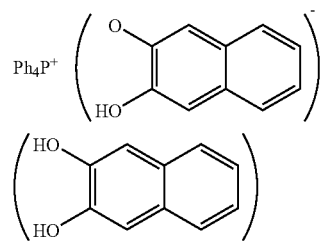

Curing accelerator 3: a curing accelerator expressed by the following formula [22]:

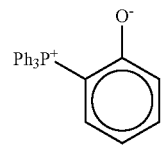

Curing accelerator 4: triphenylphosphine

Curing accelerator 5: 1,8-diazabicyclo(5.4.0)undecene-7-phenyl-triethoxysilane

TABLE 10

| | Example | | | | | | |
|---|---|---|---|---|---|---|---|
| | 74 | 75 | 76 | 77 | 78 | 79 | 80 |
| Epoxy resin 1 | 7.40 | 7.00 | 7.40 | 7.20 | 7.40 | | 8.00 |
| Epoxy resin 2 | | | | | | 6.30 | |
| Phenol resin 1 | 5.00 | 4.70 | 5.10 | 4.90 | 5.10 | 6.10 | |
| Phenol resin 2 | | | | | | | 4.40 |
| Curing accelerator 1 | 0.20 | 0.90 | 0.10 | 0.20 | 0.20 | 0.20 | 0.20 |
| Phenyltrimethoxysilane | 0.20 | 0.20 | 0.20 | 0.50 | 0.05 | 0.20 | 0.20 |
| Fused spherical silica | 86.00 | 86.00 | 86.00 | 86.00 | 86.00 | 86.00 | 86.00 |
| 1,2-Dihydroxynaphthalene | 0.20 | 0.20 | 0.20 | 0.20 | 0.20 | 0.20 | 0.20 |
| Coupling agent 1 | 0.10 | 0.10 | 0.10 | 0.10 | 0.10 | 0.10 | 0.10 |
| Coupling agent 2 | 0.10 | 0.10 | 0.10 | 0.10 | 0.10 | 0.10 | 0.10 |
| Mold release 1 | 0.20 | 0.20 | 0.20 | 0.20 | 0.20 | 0.20 | 0.20 |
| Mold release 2 | 0.10 | 0.10 | 0.10 | 0.10 | 0.10 | 0.10 | 0.10 |
| Ion trapping agent | 0.20 | 0.20 | 0.20 | 0.20 | 0.20 | 0.20 | 0.20 |
| Carbon black | 0.30 | 0.30 | 0.30 | 0.30 | 0.30 | 0.30 | 0.30 |
| Spiral flow (cm) | 108 | 89 | 123 | 118 | 103 | 106 | 104 |
| Torque ratio in curing (%) | 87 | 92 | 80 | 83 | 85 | 88 | 84 |
| Storage stability (%) | 86 | 78 | 90 | 91 | 80 | 84 | 87 |
| Filling property | good | good | good | good | good | good | good |
| Resistance to soldering (number of defect in 10 pieces) | 0 | 0 | 0 | 0 | 0 | 0 | 0 |

TABLE 11

| | Example | | | | | | | |
|---|---|---|---|---|---|---|---|---|
| | 81 | 82 | 83 | 84 | 85 | 86 | 87 | 88 |
| Epoxy resin 1 | 9.80 | 6.20 | 7.40 | 7.40 | 7.40 | 7.40 | 7.40 | 7.50 |
| Phenol resin 1 | 6.60 | 4.20 | 5.00 | 5.00 | 5.00 | 5.00 | 5.00 | 5.10 |
| Curing accelerator 1 | 0.20 | 0.20 | | | 0.15 | 0.20 | 0.20 | 0.20 |
| Curing accelerator 2 | | | 0.20 | | | | | |
| Curing accelerator 3 | | | | 0.20 | | | | |
| Curing accelerator 4 | | | | | 0.05 | | | |
| Phenyltrimethoxysilane | 0.20 | 0.20 | 0.20 | 0.20 | 0.20 | | 0.10 | 0.20 |
| Phenyltriethoxysilane | | | | | | 0.20 | 0.10 | |
| Fused spherical silica | 82.00 | 88.00 | 86.00 | 86.00 | 86.00 | 86.00 | 86.00 | 86.00 |
| 1,2-Dihydroxynaphthalene | 0.20 | 0.20 | 0.20 | 0.20 | 0.20 | 0.20 | 0.20 | 0.20 |

TABLE 11-continued

| | Example | | | | | | | |
|---|---|---|---|---|---|---|---|---|
| | 81 | 82 | 83 | 84 | 85 | 86 | 87 | 88 |
| Coupling agent 1 | 0.10 | 0.10 | 0.10 | 0.10 | 0.10 | 0.10 | 0.10 | |
| Coupling agent 2 | 0.10 | 0.10 | 0.10 | 0.10 | 0.10 | 0.10 | 0.10 | |
| Mold release 1 | 0.20 | 0.20 | 0.20 | 0.20 | 0.20 | 0.20 | 0.20 | 0.20 |
| Mold release 2 | 0.10 | 0.10 | 0.10 | 0.10 | 0.10 | 0.10 | 0.10 | 0.10 |
| Ion trapping agent | 0.20 | 0.20 | 0.20 | 0.20 | 0.20 | 0.20 | 0.20 | 0.20 |
| Carbon black | 0.30 | 0.30 | 0.30 | 0.30 | 0.30 | 0.30 | 0.30 | 0.30 |
| Spiral flow (cm) | 127 | 93 | 103 | 108 | 100 | 104 | 107 | 92 |
| Torque ratio in curing (%) | 89 | 85 | 88 | 86 | 87 | 85 | 86 | 84 |
| Storage stability (%) | 86 | 87 | 88 | 89 | 87 | 83 | 88 | 86 |
| Filling property | good | good | good | good | good | good | good | good |
| Resistance to soldering (number of defect in 10 pieces) | 0 | 0 | 0 | 0 | 0 | 0 | 0 | 0 |

TABLE 12

| | Comparative Example | | | | |
|---|---|---|---|---|---|
| | 13 | 14 | 15 | 16 | 17 |
| Epoxy resin 1 | 7.40 | 7.40 | 7.50 | 7.50 | 7.40 |
| Phenol resin 1 | 5.00 | 5.00 | 5.10 | 5.10 | 5.00 |
| Curing accelerator 1 | | | 0.20 | 0.20 | 0.20 |
| Curing accelerator 4 | 0.20 | | | | |
| Curing accelerator 5 | | 0.20 | | | |
| Phenyltrimethoxysilane | 0.20 | | | | |
| Phenyltriethoxysilane | | 0.20 | | | |
| Fused spherical silica | 86.00 | 86.00 | 86.00 | 86.00 | 86.00 |
| 1,2-Dihydroxynaphthalene | 0.20 | 0.20 | 0.20 | 0.20 | 0.20 |
| Coupling agent 1 | 0.10 | 0.10 | 0.10 | 0.10 | 0.20 |
| Coupling agent 2 | 0.10 | 0.10 | 0.10 | 0.10 | 0.20 |
| Mold release 1 | 0.20 | 0.20 | 0.20 | 0.20 | 0.20 |
| Mold release 2 | 0.10 | 0.10 | 0.10 | 0.10 | 0.10 |
| Ion trapping agent | 0.20 | 0.20 | 0.20 | 0.20 | 0.20 |
| Carbon black | 0.30 | 0.30 | 0.30 | 0.30 | 0.30 |
| Spiral flow (cm) | 81 | 78 | 79 | 83 | 85 |
| Torque ratio in curing (%) | 89 | 86 | 88 | 89 | 89 |
| Storage stability (%) | 64 | 68 | 71 | 73 | 69 |
| Filling property | fair | fair | poor | poor | fair |
| Resistance to soldering (number of defect in 10 pieces) | 7 | 8 | 4 | 5 | 3 |

Examples 74 to 88 were in accordance with the present invention, and the type and the amount of the tetra-substituted organic phosphorus compound, the type and the amount of the phenylsilane compound, the type of the resin or the amount of the filler was changed. In all cases, the spiral flow was sufficiently long, and the excellent fluidity was obtained; the torque in curing was great, and the excellent curing property was obtained; the retention of the spiral flow after storage at 30° C. one week was sufficiently great, and the excellent storage stability was obtained; voids were not found, and the excellent filling property was obtained; and cleavages or cracks were not found in the IR reflow treatment after being treated under moisture, and the excellent resistance to soldering was obtained.

On the other hand, in Comparative Examples 13 and 14, curing accelerators different from the tetra-substituted organic phosphorus compound were used, and the fluidity, the storage stability, the filling property and the resistance to soldering were poor. In Comparative Examples 15, 16 and 17, the phenylsilane compound was not used, and the fluidity, the storage stability, the filling property and the resistance to soldering were poor.

As described above, in Examples in accordance with the present invention, epoxy resin compositions (molding materials) for encapsulating semiconductors which exhibited the excellent storage stability, the excellent fluidity and curing property in the encapsulating by molding of semiconductor elements and the excellent resistance to soldering without forming any cleavages or cracks in the soldering treatment at high temperatures corresponding to the lead-free solder, could be obtained.

INDUSTRIAL APPLICABILITY

By using the epoxy resin, the curing agent, the curing accelerator and the component retarding curing of the epoxy resin in accordance with the present invention, the epoxy resin compositions exhibiting the excellent curing property, fluidity and storage stability can be obtained. The component for retarding curing used in the present invention can improve the fluidity and the storage stability without adversely affecting the curing property, and it is very easy that the latency is adjusted by adjusting the amount of the component for retarding curing to improve the desired property. The epoxy resin composition for encapsulating semiconductors which exhibits the excellent storage stability, the excellent fluidity and curing property in the formation of the encapsulated structure of semiconductor elements and the excellent resistance to soldering such that no cleavages or cracks are formed in the soldering treatment at high temperatures corresponding to the lead-free solder, can be obtained. Therefore, the epoxy resin composition can be advantageously used for producing semiconductor devices of the surface mounting type and also for applications using the epoxy resin compositions other than the semiconductor devices.

What is claimed is:

1. An epoxy resin composition which comprises an epoxy resin (A), a curing agent (B) which is a compound having two or more phenolic hydroxyl groups in a molecule, a curing accelerator which is a compound (C) having a cation portion in a molecule and a component (D) retarding curing of the epoxy resin which is at least one component selected from the group consisting of component (b') and component (c'):

(b') an anion component represented by following general formula [1] and a compound represented by following general formula [2]:

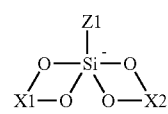

[1]

wherein X1 and X2 each represent an organic group and represent the same group or different groups, and Z1 represents a substituted or unsubstituted organic group having an aromatic ring or a heterocyclic ring or a substituted or unsubstituted aliphatic group,

[2]

wherein X3 represents an organic group;
(c') the compound represented by above general formula [2] and a silane compound represented by following general formula [3]:

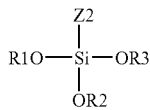

[3]

wherein R1, R2 and R3 each represent an aliphatic group having 1 to 3 carbon atoms and may represent the same group or different groups, and Z2 represents a substituted or unsubstituted organic group having an aromatic ring or a heterocyclic ring or a substituted or unsubstituted aliphatic group.

2. The epoxy resin composition according to claim 1, wherein compound (C) is a compound having phosphorus atom.

3. The epoxy resin composition according to claim 1, wherein the compound C having a cation portion in a molecule is at least one tetra-substituted organic phosphorus compound selected from the group consisting of tetra-substituted phosphonium salts (c1), phospho-betain compounds (c2) and adducts of a phosphine compound with a quinone compound (c3).

4. The epoxy resin composition according to claim 1, wherein the compound C having a cation portion in a molecule is a compound represented by following general formula [4]:

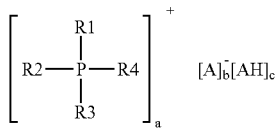

[4]

wherein P represents phosphorus atom, R1, R2, R3 and R4 each represent a substituted or unsubstituted aromatic group or alkyl group and represent the same group or different groups, A represents an anion of an aromatic organic acid having at least one functional group selected from the group consisting of hydroxyl group, carboxyl group and thiol group on an aromatic ring, AH represents an aromatic organic acid having at least one functional group selected from the group consisting of hydroxyl group, carboxyl group and thiol group on an aromatic ring, a and b each represent an integer which is from 1 to 3, c represents an integer which is from 0 to 3, and a=b.

5. The epoxy resin composition according to claim 1, wherein the compound C having a cation portion in a molecule is a compound represented by following formula [5]:

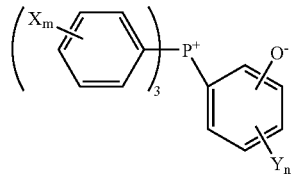

[5]

wherein X represents hydrogen atom or an alkyl group having from 1 to 3 carbon atoms, Y represents hydrogen atom or hydroxyl group, and m and n each represent a integer which is from 1 to 3.

6. The epoxy resin composition according to claim 1, wherein the compound C having a cation portion in a molecule is a compound represented by following formula [6]:

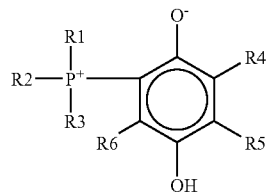

[6]

wherein P represents phosphorus atom, R1 to R3 each represent a substituted or unsubstituted alkyl group having 1 to 12 carbon atoms or a substituted or unsubstituted aryl group having 6 to 12 carbon atoms and may represent a same group or different groups, R4 to R6 may be the same or different and each represent hydrogen atom or a hydrocarbon group having 1 to 12 groups, and the hydrocarbon groups represented by R4 and R5 may be bonded to each other to form a cyclic structure.

7. The epoxy resin composition according to claim 1, wherein the silane compound represented by general formula [3] is a phenylsilane compound represented by following formula [7]:

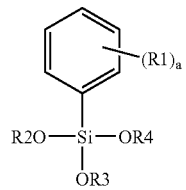

[7]

wherein R1 represents hydrogen atom or a hydrocarbon group having 4 or less carbon atoms, R2, R3 and R4 each represent an aliphatic group having 1 to 3 carbon atoms and represent the same group or different groups, and a represents an integer which is from 1 to 5.

8. The epoxy resin composition according to claim 1, wherein the component D retarding curing of the epoxy resin comprises
a phenylsilane compound represented by following formula [7]:

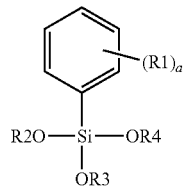

wherein R1 represents hydrogen atom or a hydrocarbon group having 4 or less carbon atoms, R2, R3 and R4 each represent an aliphatic group having 1 to 3 carbon atoms and represent the same group or different groups, and a represents an integer which is from 1 to 5, together with a compound of formula [2] in which hydroxyl group is bonded to each of two or more adjacent carbon atoms constituting an aromatic ring.

9. The epoxy resin composition according to claim 8, wherein the aromatic ring is benzene ring or naphthalene ring.

10. The epoxy resin composition according to claim 7, wherein an amount of the phenylsilane compound represented by formula [7] is from 0.05% by weight to 0.5% by weight based on an amount of the epoxy resin composition.

11. The epoxy resin composition according to claim 8, wherein an amount of the phenylsilane compound represented by formula [7] is from 0.05% by weight to 0.5% by weight based on an amount of the epoxy resin composition.

12. The epoxy resin composition according to claim 1, wherein the epoxy resin of component (A) is an epoxy resin represented by following general formula [8]:

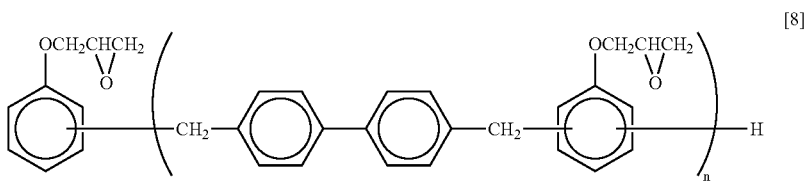

wherein n represents an average value which is a positive number of 1 to 10.

13. The epoxy resin composition according to claim 1, wherein the curing agent of component (B) is a phenol resin represented by following general formula [9]:

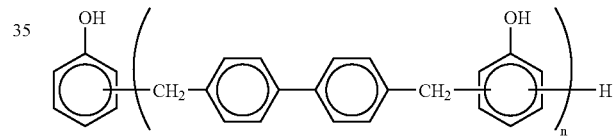

wherein n represents an average value which is a positive number of 1 to 10.

14. The epoxy resin composition according to claim 1, wherein the compound C having a cation portion in a molecule which is the curing accelerator and the component D retarding curing of the epoxy resin are mixed with each other in advance.

15. The epoxy resin composition according to claim 1, which further comprises an inorganic filler.

16. The epoxy resin composition according to claim 15, wherein an amount of the inorganic filler is 80% by weight to 94% by weight based on an amount of the epoxy resin composition.

17. An epoxy resin molding material for encapsulating semiconductors which is obtained by mixing and/or melt mixing the epoxy resin composition defined in claim 1.

18. A semiconductor device which comprises a semiconductor element encapsulated with the epoxy resin molding material of claim 17.

19. A process for providing latency to an epoxy resin composition which comprises retarding curing of the epoxy resin composition in claim 1 by adjusting an amount of the component D retarding curing of the epoxy resin relative to an amount of the compound C having a cation portion in a molecule of the curing accelerator.

* * * * *

UNITED STATES PATENT AND TRADEMARK OFFICE
CERTIFICATE OF CORRECTION

| | | |
|---|---|---|
| PATENT NO. | : 7,723,444 B2 | |
| APPLICATION NO. | : 11/336434 | |
| DATED | : May 25, 2010 | |
| INVENTOR(S) | : Yoshihito Akiyama and Naoki Tomida | |

It is certified that error appears in the above-identified patent and that said Letters Patent is hereby corrected as shown below:

Column 1, line 22, insert --as-- between the "," and the word "electronic".

Column 4, line 14, insert --;-- after "(c3)".

Column 4, line 61, replace "in" with the letter --m--.

Column 5, line 19, replace "BA" with --R4--.

Column 6, line 33, replace "R8" with --R3--.

Column 6, line 34, replace "8" with --3--.

Column 7, line 29, replace "10/a" with --%--.

Column 7, line 34, delete "10".

Column 8, line 4, replace "frilling" with --filling--.

Column 8, lines 33-34, delete duplicate phrase "type and epoxy resins of the phenol".

Column 9, line 37, replace "Ep1Ph" with --Ep/Ph--.

Column 9, line 56, delete the space between "(5.4.0)" and "undecene-", and insert --7-- between "undecene-" and ",".

Column 9, line 57, delete "." between "ben" and "zyldimethylamine".

Column 11, line 5, replace "R1" with --[4]--.

Column 13, line 25, replace "R8" with --R3--.

Column 13, line 26, delete "atom's" and insert --atoms--.

Column 13, line 41, replace "=substituted" with --unsubstituted--.

Column 13, line 43, replace "2,8" with --2,3--.

Column 14, line 41, insert --)-- at the end of the word "o-catechol".

Column 14, line 59, delete "." between "formula" and "[2]".

Column 14, line 62, replace "D1" with --[1]--.

Column 14, line 65, insert --[2]-- between "formula" and "is".

Signed and Sealed this
Twentieth Day of December, 2011

David J. Kappos
*Director of the United States Patent and Trademark Office*

Column 15, line 33, replace "[8]" with --[3]--.

Column 15, line 37, delete "-".

Column 15, line 55, replace "8" with --3--.

Column 15, line 65, replace "leas" with --less--.

Column 16, line 15, replace "alarm" with --silane--.

Column 16, line 20, replace "slime" with --silane--.

Column 16, line 46, replace "atingg" with --ating--.

Column 16, line 58, replace "[8]" with --[3]--.

Column 16, line 62, replace "[8]" with --[3]--.

Column 17, line 20, delete "," between "mixed" and "in".

Column 18, line 42, insert --γ- -- before "glycidoxytrimethoxysi-".

Column 18, line 54, replace "aflame" with --silane--.

Column 18, line 56, replace "aminosilane" with --anilinosilane--.

Column 19, line 6, replace "adds" with --acids--.

Column 21, line 48, insert --(5-- before the word "mmole)".

Column 22, line 67, insert --.-- after "obtained".

Column 23, line 16, insert --$^1$H-NMR,-- between "with" and "the".

Column 33, line 14, replace "8" with --3--.

Column 33, line 67, replace "EMMI-1-66" with --EMMI-I-66--.

Column 35, line 56, insert --, 48 parts by weight of the phenol aralkyl resin XLC-LL [trade name, manufactured by MITSUI KAGAKU Co., Ltd.], 8.8 parts by weight-- between "weight" and "of".

Column 36, line 19, replace "67" with --57--; delete "." between "Comparative" and "Examples".

Column 36, line 66, replace "(6)" with --(5)--.

Column 38, line 44, replace "EMMI-1-66" with --EMMI-I-66--.

Column 38, line 47, insert --.-- after "mm".

Column 39, line 18, replace "9.8" with --9.3--.

Column 42, line 23, replace "30° 0" with --30°C--.

Column 43, line 26, replace "RLC-LL" with --XLC-LL--.